(12) United States Patent
Hiraga et al.

(10) Patent No.: US 11,101,450 B2
(45) Date of Patent: Aug. 24, 2021

(54) DISPLAY DEVICE

(71) Applicant: Japan Display Inc., Tokyo (JP)

(72) Inventors: Kenta Hiraga, Tokyo (JP); Hajime Akimoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/729,681

(22) Filed: Dec. 30, 2019

(65) Prior Publication Data

US 2020/0136082 A1 Apr. 30, 2020

Related U.S. Application Data

(63) Continuation of application No. 15/969,848, filed on May 3, 2018, now Pat. No. 10,553,829.

(30) Foreign Application Priority Data

May 15, 2017 (JP) .............................. JP2017-096268

(51) Int. Cl.
*H01L 51/52* (2006.01)
*H01L 27/32* (2006.01)
*H01L 51/00* (2006.01)

(52) U.S. Cl.
CPC ........ *H01L 51/529* (2013.01); *H01L 27/3276* (2013.01); *H01L 51/0097* (2013.01); *H01L 51/5253* (2013.01); *H01L 27/323* (2013.01); *H01L 2227/323* (2013.01); *H01L 2251/5338* (2013.01)

(58) Field of Classification Search
CPC ............... H01L 27/3244; H01L 27/323; H01L 51/5253; H01L 51/529; H01L 51/0097; H01L 27/3276; H01L 2251/5338; H01L 2227/323; Y02E 10/549
See application file for complete search history.

(56) References Cited

U.S. PATENT DOCUMENTS

| | | | |
|---|---|---|---|
| 2002/0024096 A1* | 2/2002 | Yamazaki | H01L 51/524 257/359 |
| 2008/0070385 A1* | 3/2008 | Won | C23C 8/36 438/482 |
| 2008/0100590 A1* | 5/2008 | Hur | G06F 3/0412 345/173 |
| 2010/0308335 A1 | 12/2010 | Kim et al. | |
| 2014/0117342 A1 | 5/2014 | Kwon et al. | |
| 2014/0183473 A1* | 7/2014 | Lee | H01L 51/0097 257/40 |

(Continued)

FOREIGN PATENT DOCUMENTS

JP 5791673 B2 10/2015

*Primary Examiner* — Ermias T Woldegeorgis
(74) *Attorney, Agent, or Firm* — Michael Best & Friedrich LLP

(57) ABSTRACT

A display device includes a flexible substrate including a first surface and a second surface facing the first surface; a TFT array layer provided on the first surface; a display element layer provided on the TFT array layer; a first heat releasing layer provided on the second surface; a first protective layer provided on the same side as the second surface; a second heat releasing layer provided on the display element layer; and a second protective layer provided on the display element layer. The second heat releasing layer has a light transmittance of 90% or higher.

11 Claims, 16 Drawing Sheets

(56) References Cited

U.S. PATENT DOCUMENTS

2015/0014635 A1* 1/2015 Noh .................... H01L 27/3272
257/40
2015/0021565 A1* 1/2015 Min .................... H01L 51/5256
257/40

* cited by examiner

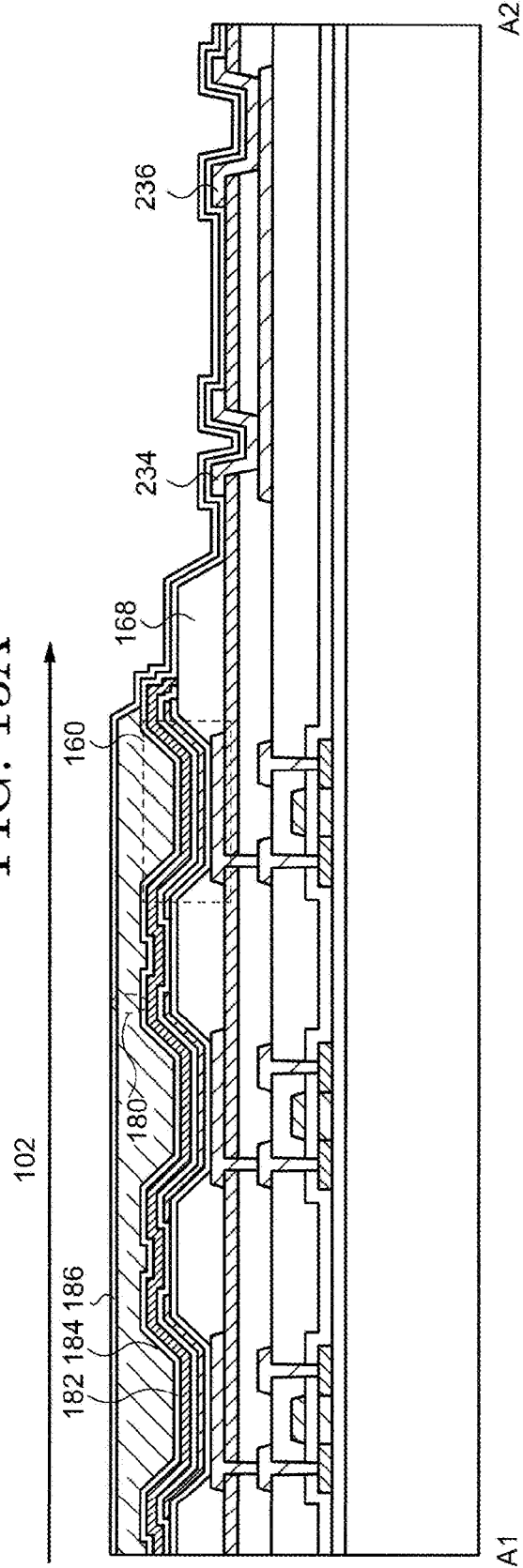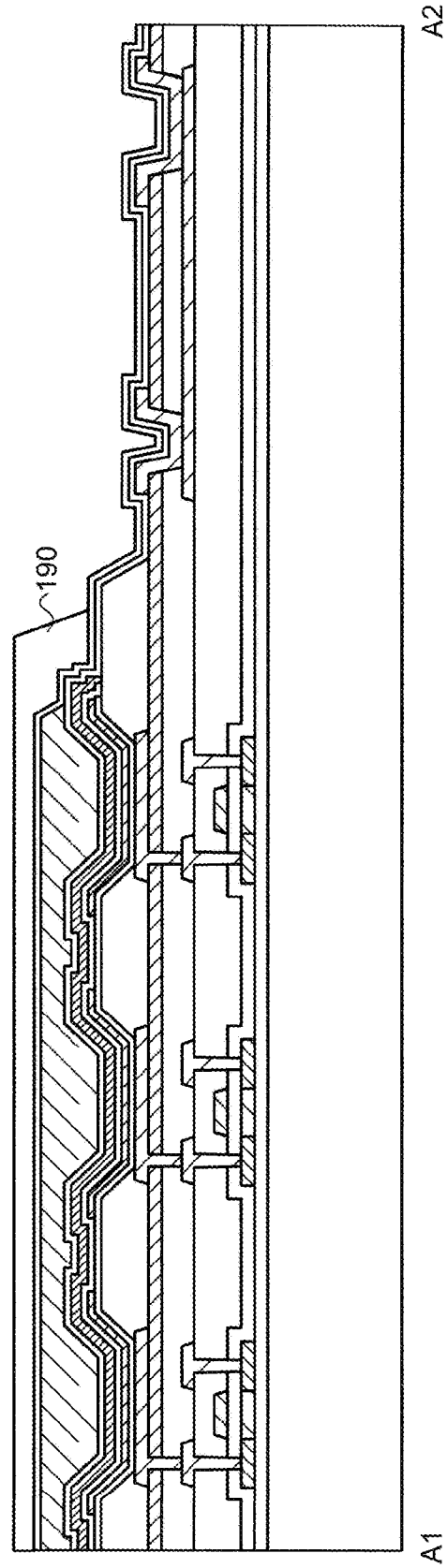

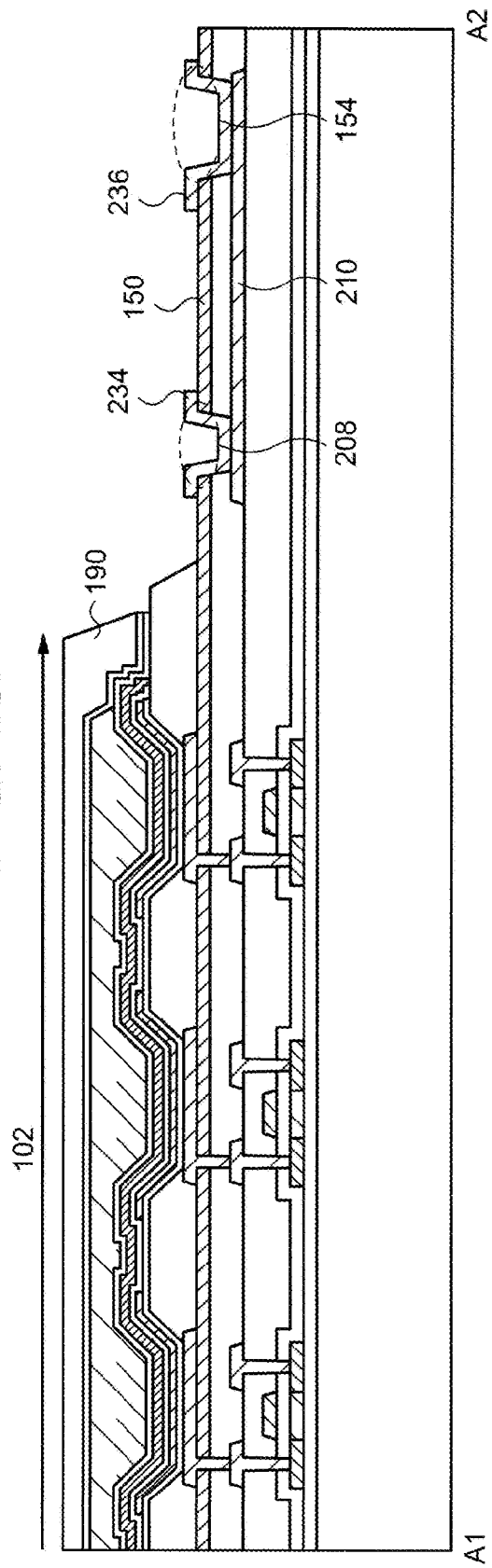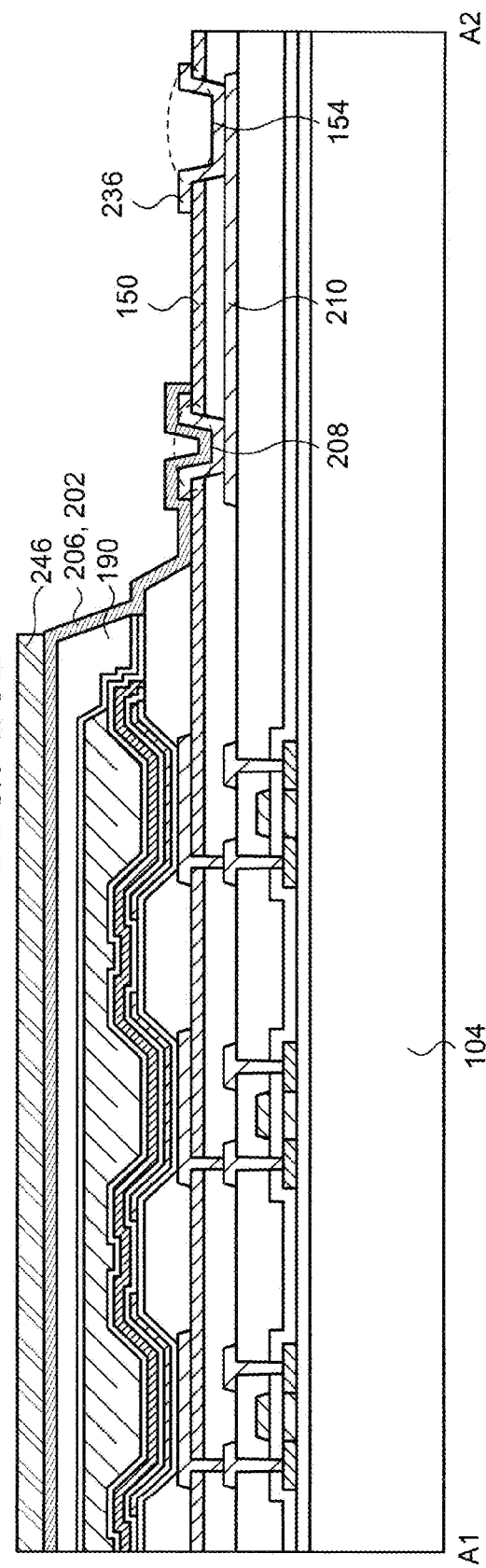

DISPLAY DEVICE

CROSS REFERENCE TO RELATED APPLICATIONS

This application is a continuation of U.S. patent application Ser. No. 15/969,848, filed on May 3, 2018. Further, this application is based upon and claims the benefit of priority from the prior Japanese Patent Application No. 2017-096268, filed on May 15, 2017, the entire contents of which are incorporated herein by reference.

FIELD

An embodiment of the present invention relates to a display device, for example, a flexible display device.

BACKGROUND

A display device is often produced to include a glass substrate. The glass substrate is heavy and is easily broken when being subjected to an impact. Recently, a so-called flexible display device including a flexible substrate formed of, for example, a resin, which is lightweight and is not easily broken, is a target of attention. The flexible display device is required to be durable against bending. For example, Japanese Patent No. 5791673 discloses a display device that is improved in the durability against repeated bending and is bendable at a larger angle.

SUMMARY

An embodiment of the present invention is directed to a display device including a flexible substrate including a first surface and a second surface facing the first surface; a TFT array layer provided on the first surface; a display element layer provided on the TFT array layer; a first heat releasing layer provided on the second surface; a first protective layer provided on the same side as the second surface; a second heat releasing layer provided on the display element layer; and a second protective layer provided on the display element layer. The second heat releasing layer has a light transmittance of 90% or higher.

BRIEF DESCRIPTION OF DRAWINGS

FIG. 15A is a schematic cross-sectional view showing a step of the method for producing the display device in the still another embodiment according to the present invention;

FIG. 15B is a schematic cross-sectional view showing a step of the method for producing the display device in the still another embodiment according to the present invention;

FIG. 16A is a schematic cross-sectional view showing a step of the method for producing the display device in the still another embodiment according to the present invention; and FIG. 16B is a schematic cross-sectional view showing a step of the method for producing the display device in the still another embodiment according to the present invention.

DESCRIPTION OF EMBODIMENTS

Figure 1:
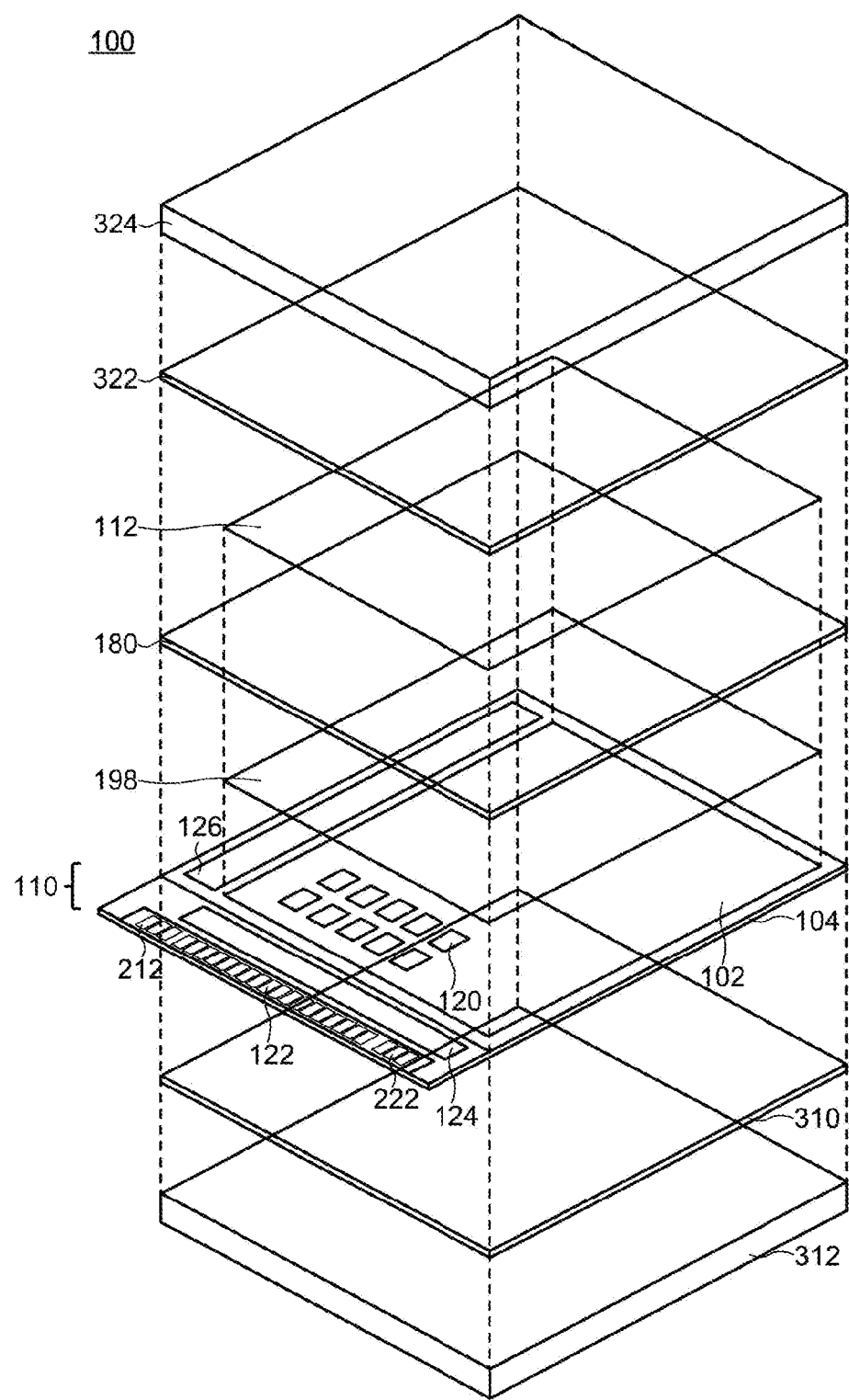
FIG. 1 is a schematic perspective view of a display device in one embodiment according to the present invention.

Hereinafter, embodiments of the present invention will be described with reference to the drawings and the like. The present invention may be carried out in various forms, and is not to be construed as being limited to any of the following embodiments. In the drawings, components may be shown schematically regarding the width, thickness, shape and the like, instead of being shown in accordance with the actual sizes, for the sake of clearer illustration. The drawings are merely examples and do not limit the interpretations of the present invention in any way. In the specification and the drawings, components that have substantially the same functions as those described before with reference to a previous drawing(s) bear the identical reference signs thereto (or the identical reference signs with "a", "b" or the like after the signs), and detailed descriptions thereof may be omitted. The terms "first", "second" or the like provided for each of the components are used for the sake of convenience in order to distinguish the components, and do not have any other significance unless otherwise specified.

In this specification, an expression that a component (first component) is "on" (or "above" or "below") another component (second component) encompasses a case where such a component (first component) is in contact with the another component (second component) and also a case where such a component (first component) is above or below the another component (second component), namely, a case where still another component (third component) is provided between such a component (first component) and the another component (second component), unless otherwise specified. In the following description, regarding a cross-sectional view, the side on which the TFT array layer is provided with respect to a first substrate will be referred to as "above", and the opposite side will be referred to as "below" unless otherwise specified.

In this specification, the first substrate (flexible substrate) includes at least one planar main surface, and layers including an insulating layer, a semiconductor layer and a conductive layer or elements including a transistor, a display element and the like are provided on the one main surface. In the following description, regarding a cross-sectional view, the one surface of the first substrate (flexible substrate) will be used as the reference. Unless otherwise specified, the terms "upper layer", "above" and "upper surface" used regarding the first substrate will be used with respect to the one main surface of the first substrate.

A flexible display device includes a plurality of layers provided in a stacked manner. When being bent, the flexible display device receives a bending moment. As a result, a surface of one layer is expanded, whereas a surface of another layer is contracted. There is also a face that is not expanded or contracted, and such a face is referred to as, for example, a neutral surface. When the flexible display device is bent, the layers farther from the neutral surface receive a stronger force in a tensile direction or in a compression direction. Upon receipt of heat generated in a display element displaying an image, external heat or the like, the layers are, for example, thermally contracted or expanded. As a result, the position of the neutral surface is changed. Such a positional change of the neutral surface breaks lines or transistors included in the display device, or causes the layer including the display element to be delaminated. This causes the image displayed by the flexible display device to be darker or brighter, or causes a part of the image not to be displayed.

Some embodiments described below are directed to a flexible display device provided in consideration of the position of the neutral surface.

Embodiment 1

A structure of a display device in an embodiment according to the present invention will be described.

FIG. 1 is a schematic perspective view of a display device 100 in one embodiment according to the present invention. A display element layer 198 includes display elements allowing the display device 100 to display an image. The display elements are included in the pixels 120. Needless to say, the display elements are included in a display layer 102. However, for easier understanding, FIG. 1 shows the display element layer 198 as being separated from a display layer 102.

The display device 100 includes the display layer 102 displaying an image. The display layer 102 is located on a first surface of a flexible substrate 104. The display layer 102 is formed over both the TFT array layer 110 and the display element layer 198. The display layer 102 includes a plurality of pixels 120 arrayed in one direction and another direction crossing the one direction. A sealing layer 180 and a touch sensor layer 112 are provided as overlapping the display layer 102. A first heat releasing layer 310 and a first protective layer 312 are provided on a second surface of the flexible substrate 104. In other words, the first protective layer 312 is located on the same side as the second surface of the flexible substrate 104 with respect to the display layer 102. A second heat releasing layer 322 and a second protective layer 324 are provided on an upper surface of the touch sensor layer 112. Namely, in a region where the first heat releasing layer 310, the display layer 102 and the second heat releasing layer 322 stack on each other, the first heat releasing layer 310 is located below the display layer 102, and the second heat releasing layer 322 is located above the display layer 102. Thicknesses of the first heat releasing layer 310, the second heat releasing layer 322, the first protective layer 312 and the second protective layer 324 are adjusted such that the neutral surface of the display device 100 is located in the vicinity of the TFT array layer 110 and the display element layer 198. In other words, the neutral surface of the display device 100 is located in a layer including the TFT array layer 110 and the display element layer 198. The TFT array layer 110 and the display element layer 198 may each be thinner than the flexible substrate 104. The first protective layer 312 may be thinner than the second protective layer 324.

The above-described structure of the display device 100 allows the heat to escape efficiently and suppresses the position of the neutral surface of the display device 100 from being changed by the heat.

FIG. 1 further shows first terminals 212, second terminals 222, third terminals 122, an IC chip 124 and a scanning line driving circuit 126. The first terminals 212 and the second terminals 222 are supplied with a touch sensor signal via an external circuit (not shown). A touch sensor signal is supplied to the touch sensor layer 112. The third terminals 122 supply a signal to the pixels 120 via an external circuit (not shown). The IC chip 124 and the scanning signal driving circuit 126 control the driving of the pixels 120.

Figure 2:
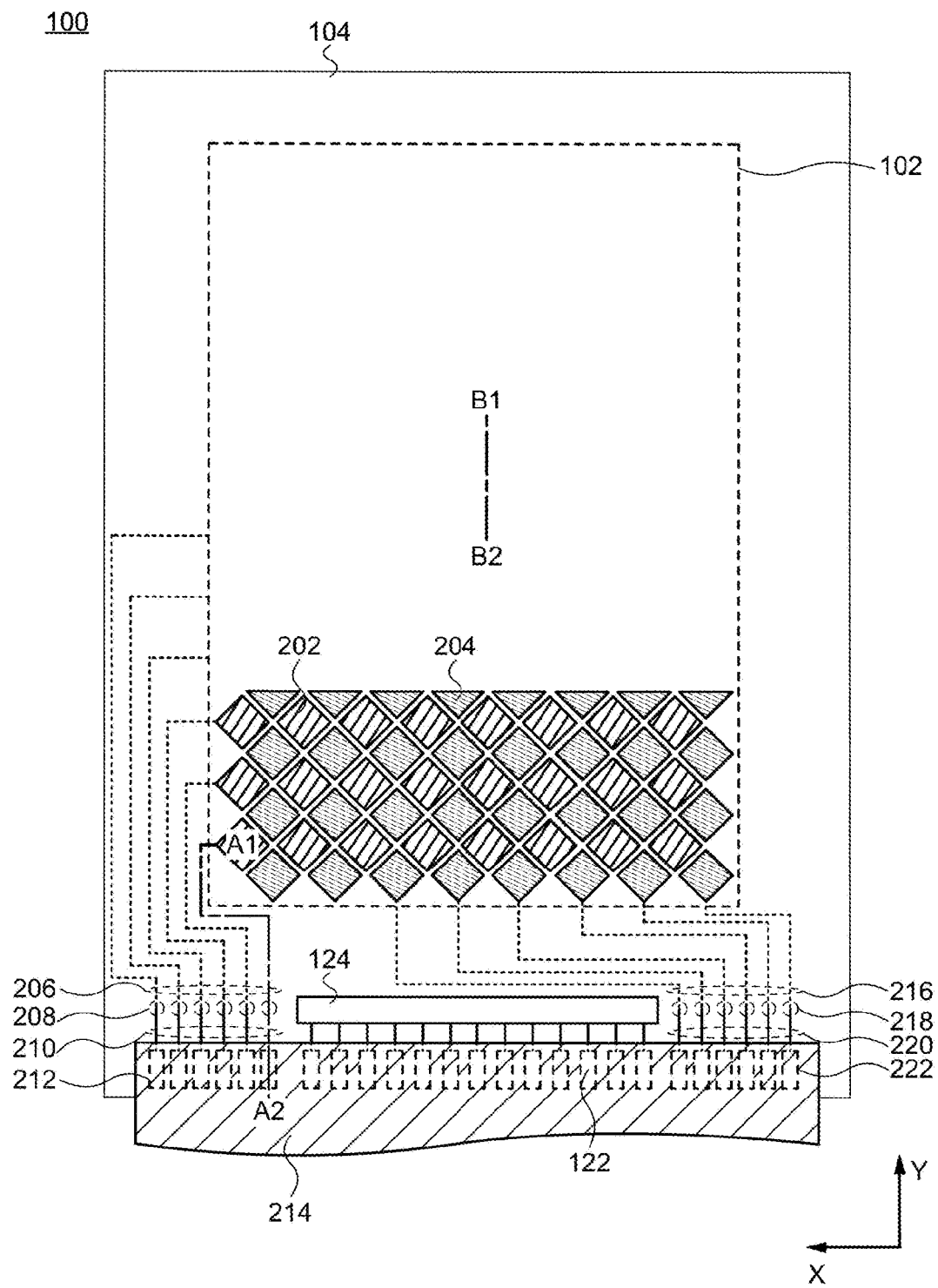
FIG. 2 is a schematic plan view of the display device in the one embodiment according to the present invention.

FIG. 2 is a schematic plan view of the display device 100 in this embodiment of the present invention. For easier understanding, FIG. 2 shows the flexible substrate 104, the display layer 102 and the touch sensor layer 112. In actuality, the first heat releasing layer 310 and the first protective layer 312 are located below the flexible substrate 104, and the second heat releasing layer 322 and the second protective layer 324 are located above the touch sensor layer 112.

The TFT array layer 110 and the display element layer 198 are located on the first surface of the flexible substrate 104. As described above, the display layer 102 is formed over both the TFT array layer 110 and the display element layer 198. The display layer 102 includes the plurality of pixels 120. The IC chip 124 and the scanning signal driving circuit 126 (FIG. 1) controlling the driving of the pixels 120 are located outer to the display layer 102. In this example, the scanning signal driving circuit 126 is located directly on the flexible substrate 104. The present invention is not limited to this. For example, the scanning signal driving circuit 126 may be provided on a substrate different from the flexible substrate 104 (e.g., on a semiconductor substrate, etc.). The substrate on which the scanning signal driving circuit 126 is provided may be located on the flexible substrate 104 or a connector 214. The scanning signal driving circuit 126 may control the pixels 120. Alternatively, a part of the scanning signal driving circuit 126 may be provided on a substrate different from the flexible substrate 104, and the substrate on which the part of the scanning signal driving circuit 126 is provided may be located on the flexible substrate 104 or the connector 214. Still alternatively, a driving circuit included in the IC chip 124, or a part of such a driving circuit, may be provided directly on the flexible substrate 104.

The touch sensor layer 112 includes a plurality of first touch electrodes 202 and a plurality of second touch electrodes 204. The touch sensor layer 112 may include a touch detection layer having substantially the same size and substantially the same shape as those of the display layer 102. With such a structure, the touch sensor layer 112 is allowed to be formed in a series of steps of forming the TFT array layer 110 and the display element layer 198. With such a structure, it is possible to provide the display device 100 having a so-called in-cell type touch sensor. The touch detection layer of the touch sensor layer 112 is not limited to having such a structure. For example, the touch sensor layer 112 may be formed on another substrate so as to be smaller than the flexible substrate 104 and larger than the display layer 102, and the display device 100 may be formed by bonding another substrate on which the touch sensor layer 112 is formed and the substrate 104 on which components other than the touch sensor layer 112 is formed. In such a case, the touch detection layer is in a region larger than the display layer 102. Therefore, even when an end of the display layer 102 is touched, the touch may be detected with high precision.

The first touch electrodes 202 are electrically connected with first lines 206 extending from a region outer to the display layer 102. The first lines 206 extend outer to the display layer 102 and are electrically connected with first terminal lines 210 via contact holes 208. The first terminal lines 210 are exposed in the vicinity of an end of the display device 100 to form the first terminals 212. The first terminals 212 are electrically connected with the connector 214 such as a flexible printed circuit (FPC) substrate or the like. A touch sensor signal is supplied to the first touch electrodes 202 from the external circuit (not shown) via the first terminals 212.

Similarly, the second touch electrodes 204 are electrically connected with second lines 216 extending from a region outer to the display layer 102. The second lines 216 extend outer to the display layer 102 and are electrically connected with second terminal lines 220 via contact holes 218. The second terminal lines 220 are exposed in the vicinity of an end of the display device 100 to form the second terminals 222. The second terminals 222 are electrically connected with the connector 214. A touch sensor signal is supplied to the second touch electrodes 204 from the external circuit (not shown) via the second terminals 222.

Although not shown, the display elements included in the display element layer 198 are, for example, light emitting elements or liquid crystal elements. The display elements are included in the pixels 120. In the display layer 102, the plurality of display elements is arrayed in one direction and another direction crossing the one direction. The TFT array layer 110 includes a plurality of semiconductor elements, of various types, controlling capacitances or the like included in the pixels 120, and a plurality of lines. The plurality of semiconductor elements of various types are, for example, transistors, capacitors, and resistors. The pixels 120 each include at least one display element, at least one transistor and at least one line that are connected with each other.

Figure 3A:
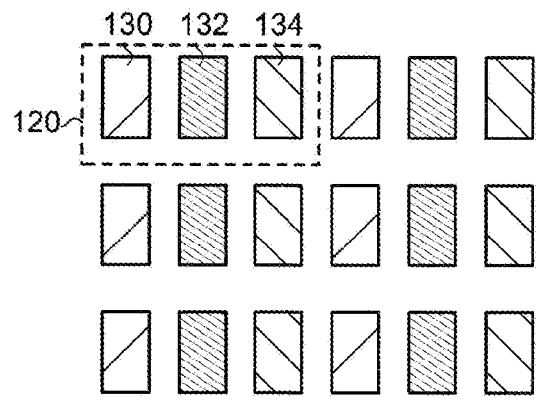
FIG. 3A is a schematic view of pixels that may be included in the display device in the one embodiment according to the present invention.
Figure 3B:
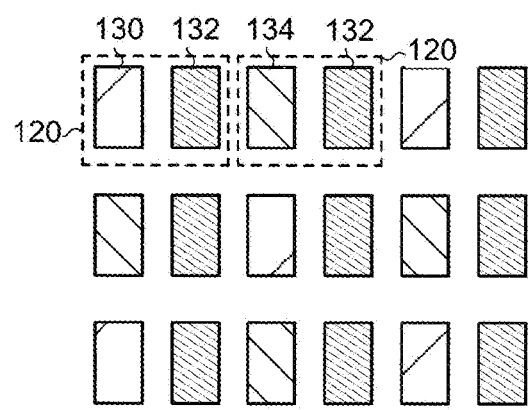
FIG. 3B is a schematic view of pixels that may be included in the display device in the one embodiment according to the present invention.
Figure 3C:
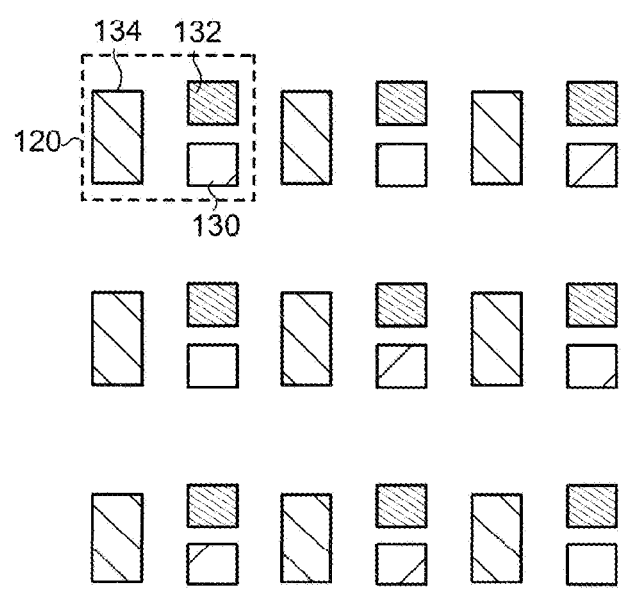
FIG. 3C is a schematic view of pixels that may be included in the display device in the one embodiment according to the present invention.

FIG. 3A, FIG. 3B and FIG. 3C are schematic views of the pixels 120 included in the display device 100 in this embodiment of the present invention.

The pixels 120 each includes a plurality of sub pixels. For example, as shown in FIG. 3A, one pixel 120 includes a sub pixel 130, a sub pixel 132 and a sub pixel 134. The sub pixels each include one display element such as a light emitting element, a liquid crystal element or the like. The color provided by each sub pixel is determined by characteristics of the light emitting element or characteristics of a color filter provided on the sub pixel. In this specification and the claims, the pixels 120 each include a plurality of sub pixels. The plurality of sub pixels each include one display element and provide at least one color. The color provided by at least one of the plurality of sub pixels is different from the color provided by at least one sub pixel among the other sub pixels. The pixel 120 is the minimum unit that forms a part of an image reproduced by the display layer 102. The sub pixels included in the display layer 102 are each included in either one of the pixels 120.

In the array shown in FIG. 3A, the sub pixel 130, the sub pixel 132 and the sub pixel 134 may be configured to provide different colors from each other. For example, the sub pixel 130, the sub pixel 132 and the sub pixel 134 may include light emitting elements respectively emitting red light, green light and blue light, which are the three primary colors of light. A 256-level voltage or current may be provided to each of the three sub pixels, so that the display device 100 provides full-color display.

In the array shown in FIG. 3B, one pixel 120 includes two sub pixels providing different colors from each other. For example, one pixel 120 may include the sub pixel 130 providing red and the sub pixel 132 providing green, and another pixel 120 adjacent to the one pixel 120 may include the sub pixel 134 providing blue and the pixel 132 providing green. In this case, two adjacent pixels 120 reproduce different color ranges from each other.

The sub pixels included in each pixel 120 do not need to have the same area size with each other. For example, as shown in FIG. 3C, one sub pixel may have a larger area size than that of each of the other two sub pixels. In this case, for example, the sub pixel 134 providing blue may be formed to have a larger area size, and the sub pixel 132 providing green and the sub pixel 130 providing red may be formed to have area sizes that are the same as each other and are smaller than that of the sub pixel 134.

Figure 4:
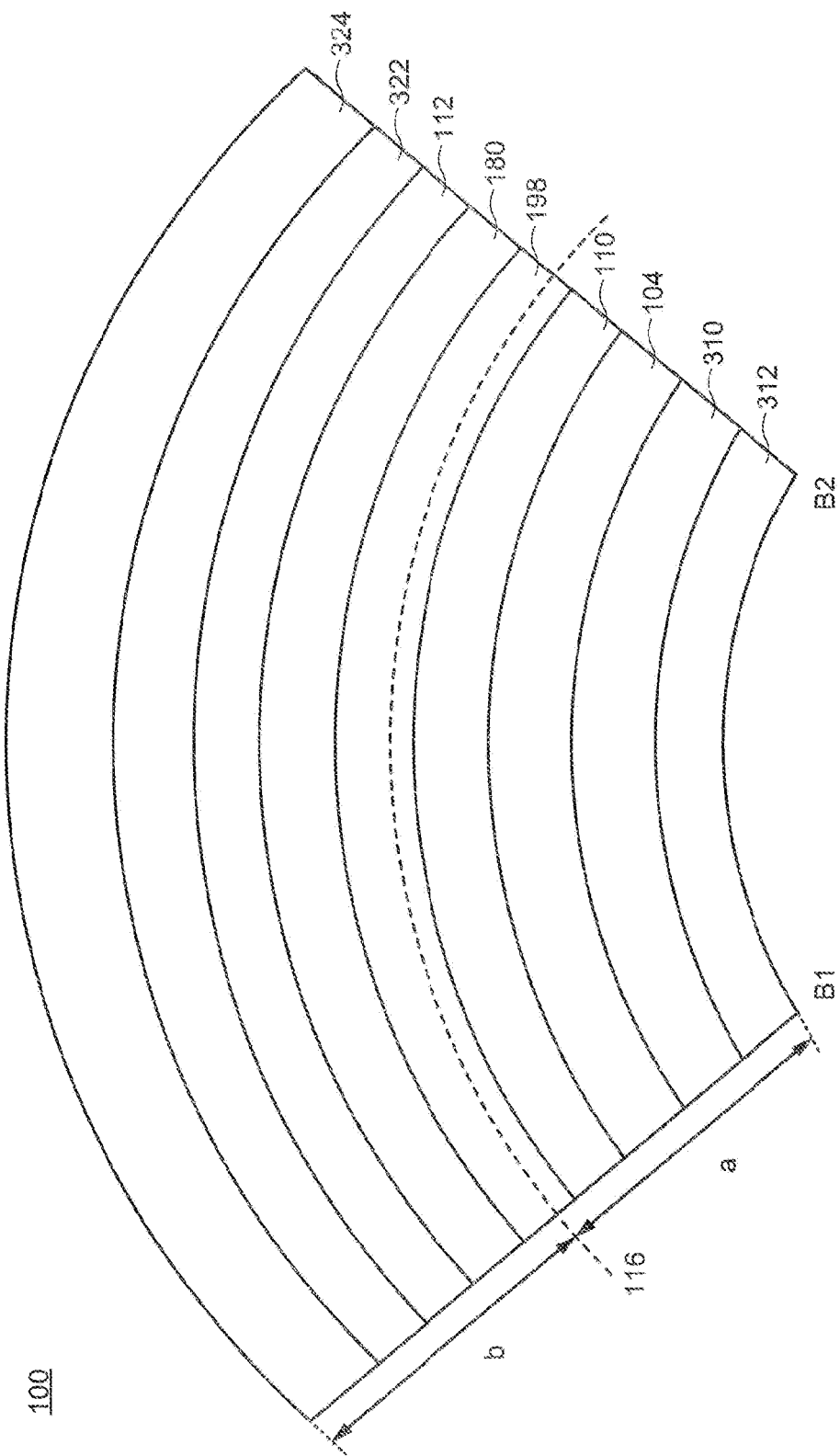
FIG. 4 is a schematic cross-sectional view of the display device in the one embodiment according to the present invention.

FIG. 4 is a schematic cross-sectional view of the display device 100 in this embodiment according to the present invention. FIG. 4 schematically shows a cross-section taken along line B1-B2 in FIG. 2

Figure 5:
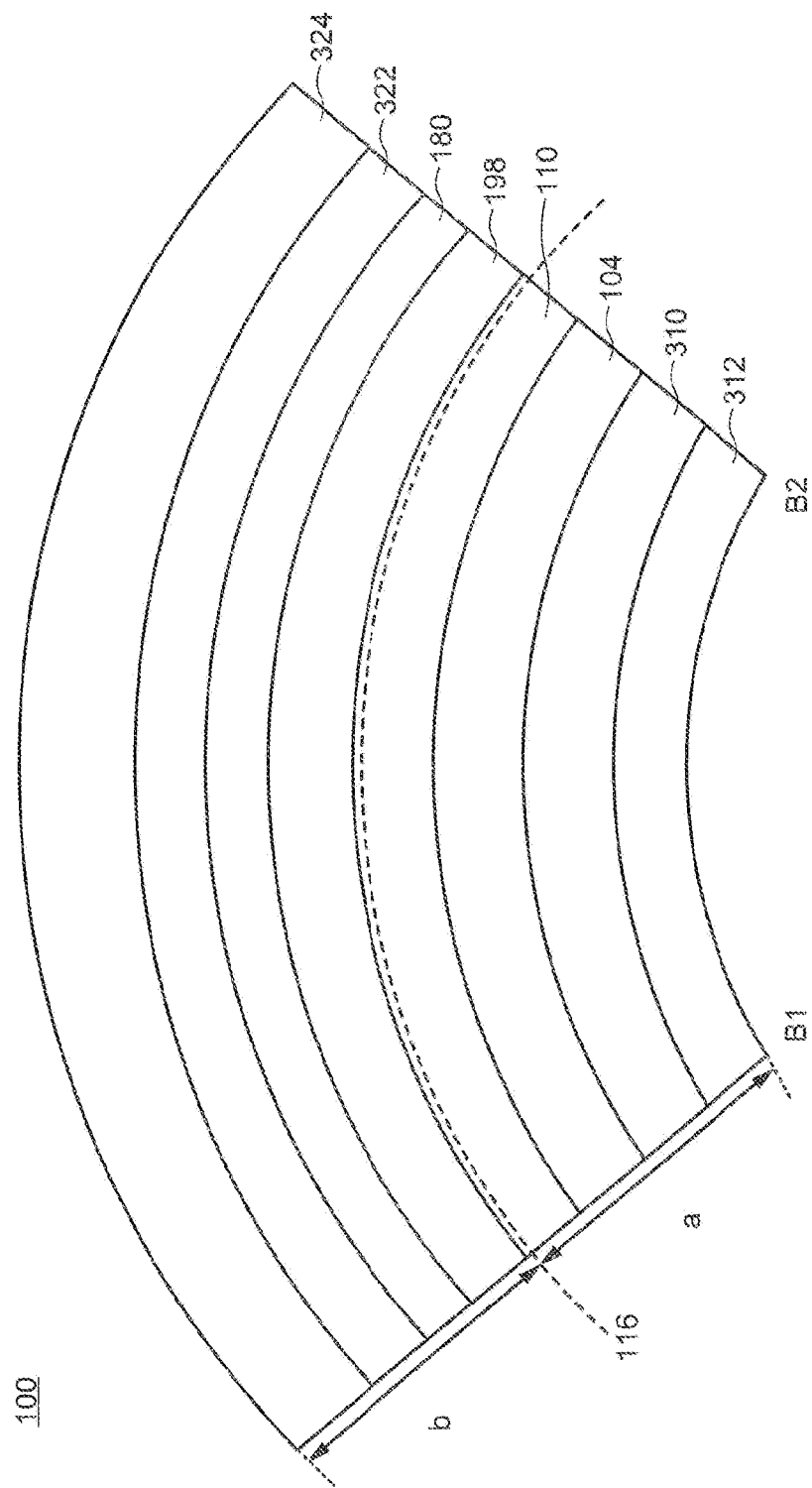
FIG. 5 is a schematic cross-sectional view of the display device in the one embodiment according to the present invention.

As shown in FIG. 4, the display device 100 in this embodiment according to the present invention includes the first protective layer 312, the first heat releasing layer 310, the flexible substrate 104, the TFT array layer 110, the display element layer 198, the sealing layer 180, the touch sensor layer 112, the second heat releasing layer 322, and the second protective layer 324. The display layer 102 displaying an image is formed over both the TFT array layer 110 and the display element layer 198. The first heat releasing layer 310 is located below the display layer 102, and the second heat releasing layer 322 located above the display layer 102. As shown in FIG. 5, the display device 100 may not include the touch sensor layer 112. In FIG. 4 and FIG. 5, the layers, films and regions are shown as having substantially the same thickness as each other for easier understanding of the stack structure of the display device 100. In actuality, the first protective layer 312 and the second protective layer 324 are thicker than the other layers, films and regions. The first heat releasing layer 310 and the second heat releasing layer 322 are thicker than the other layers, films and regions although being thinner than the first protective layer 312 and the second protective layer 324.

The thicknesses of the first heat releasing layer 310, the second heat releasing layer 322, the first protective layer 312 and the second protective layer 324 are adjusted such that a neutral surface 116 of the display device 100 is located in the vicinity of the TFT array layer 110 and the display element layer 198. For example, the first heat releasing layer 310 is made thinner than the second heat releasing layer 322, and the first protective layer 312 is made thicker than the second protective layer 324. Where the thickness of a region below the neutral surface 116 is "a" and the thickness of a region above the neutral surface 116 is "b", the neutral surface 116 is located such that a=b, namely, the neutral surface 116 is located in the vicinity of the TFT array layer 110 and the display element layer 198 (in FIG. 4, the neutral surface 116 is included in the display element layer 198). In other words, the neutral surface of the display device 100 is located in a layer including the TFT array layer 110 and the display element layer 198.

The position of the neutral surface 116 may be represented by, for example, expression 1 shown below. In expression 1, H is the height from a lower surface of the display device 100, Ei is the Young's modulus of a material used to form the i'th layer from the lower surface of the display device 100, and Ti is the thickness of the material used to form the i'th layer. N is a positive integer of 1 or greater.

$$H = \frac{1}{2} \times \frac{\sum_{i=1}^{N} E_i (T_i^2 - T_{i-1}^2)}{\sum_{i=1}^{N} E_i (T_i - T_{i-1})} \quad (1)$$

The position of the neutral surface 116 may be calculated based on the materials of the layers included in the display device 100, the thicknesses thereof, and the like.

In a production process of the display device 100, the first heat releasing layer 310, the second heat releasing layer 322, the first protective layer 312 and the second protective layer 324 may be bonded in a final step. The display device 100 having the above-described structure has the neutral surface 116 located in the vicinity of the TFT array layer 110 and the display element layer 198, which have a direct influence on the display device 100 when a part thereof is broken or delaminated. With the above-described structure, the display device 100 allows the thicknesses of the first heat releasing layer 310, the second heat releasing layer 322, the first protective layer 312 and the second protective layer 324 to be adjusted easily.

With the above-described structure, even when the display device 100 is bent, the tensile stress and the compression stress applied to the TFT array layer 110 and the display element layer 198 in the vicinity of the neutral surface 116 may be minimum. Therefore, in the display device 100, the transistors or the capacitors included in the TFT array layer 110 and the display element layer 198 in the vicinity of the neutral surface 116 are prevented from being broken by the generated heat, or the display elements are prevented from being delaminated by the generated heat. The display device 100 having the above-described structure allows the position of the neutral surface 116 to be adjusted and has a high level of durability against bending and a high level of reliability against heat.

Embodiment 2

In this embodiment, another structure of the display device according to the present invention will be described. Components same as those in embodiment 1 may not be described.

Figure 6:
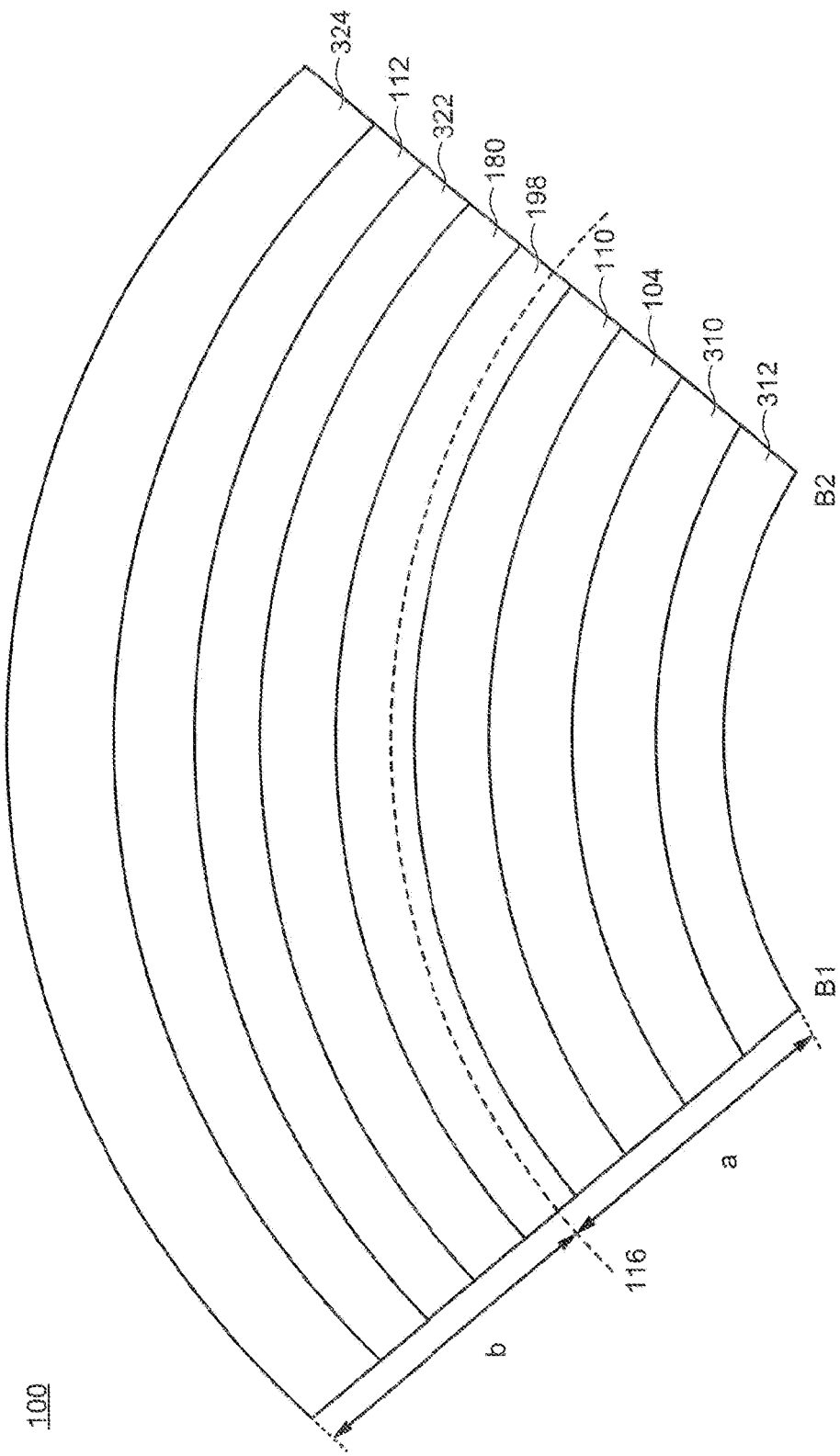
FIG. 6 is a schematic cross-sectional view of the display device in another embodiment according to the present invention.

FIG. 6 is a schematic cross-sectional view of the display device 100 in this embodiment according to the present invention. The display device 100 shown in FIG. 6 is different from the display device 100 shown in FIG. 4 in the position of the touch sensor layer 112. Except for this point, the display device 100 in FIG. 6 is the same as that in FIG. 4, and the same components will not be described. In FIG. 6 also, the layers, films and regions are shown as having substantially the same thickness for easier understanding of the stack structure of the display device 100. In actuality, the first protective layer 312 and the second protective layer 324 are thicker than the other layers, films and regions. The first heat releasing layer 310 and the second heat releasing layer 322 are thicker than the other layers, films and regions although being thinner than the first protective layer 312 and the second protective layer 324.

The touch sensor layer 112 is located between the second heat releasing layer 322 and the second protective layer 324.

In the display device 100 having such a structure, the second heat releasing layer 322 is closer to the display element layer 198. Therefore, even if the display element layer 198 generates heat, the second heat releasing layer 322 allows the heat to escape easily.

Since the display element layer 198 and the second heat releasing layer 322 are closer to each other, the second heat releasing layer 322 may be thinned so as to have a heat releasing characteristic equivalent to that of the first heat releasing layer 310. In this case, the second heat releasing layer 322 is more light-transmissive than the first heat releasing layer 310. Alternatively, the second heat releasing layer 322 may be formed of a material having a smaller thickness than, and has a higher light transmittance than, the material of the first heat releasing layer 310. The display device 100 having such a structure allows the position of the neutral surface 116 to be adjusted relatively easily and has a high luminance.

Since the display element layer 198 and the second heat releasing layer 322 are closer to each other, the sealing layer 180 may be thinned. It is preferred that the sealing layer 180 contains, for example, a material having a high heat conductivity. A material having a high heat conductivity is, for example, an inorganic insulating material such as silicon nitride (SiN) or the like. With such a structure of the display device 100, the region below the neutral surface 116 and the region above the neutral surface 116 have equivalent heat releasing characteristics to each other.

In this embodiment, the first heat releasing layer 310, the second heat releasing layer 322, the first protective layer 312, the second protective layer 324 and the touch sensor layer 112 may be bonded in a final step. The display device 100 having the above-described structure allows the position of the neutral surface 116 to be adjusted easily. The display device 100 having the above-described structure has a high level of durability against bending and a high level of reliability against heat.

Embodiment 3

In this embodiment, still another structure of the display device according to the present invention will be described. Components same as those in embodiment 1 and embodiment 2 may not be described.

Figure 7:
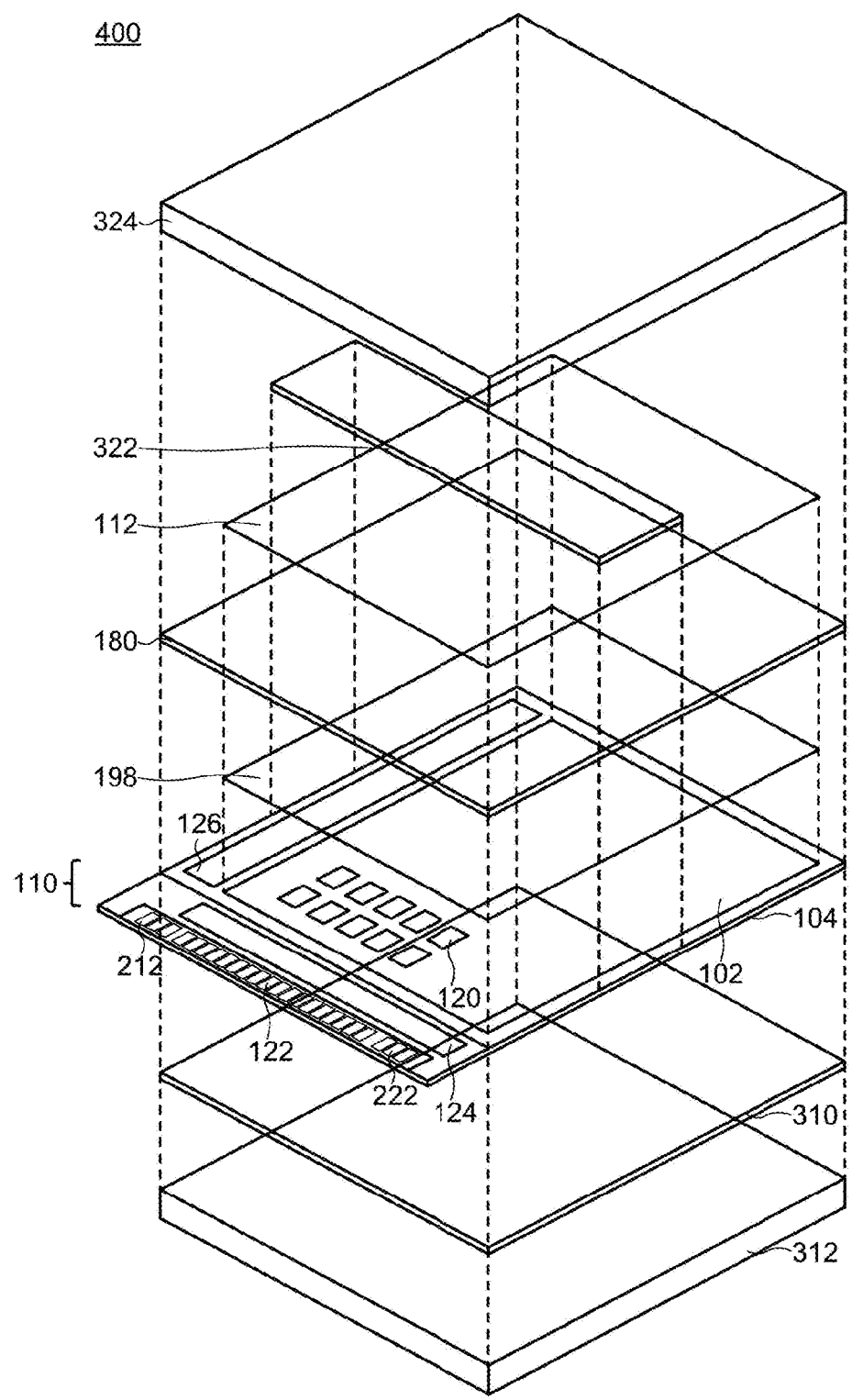
FIG. 7 is a schematic perspective view of a display device in still another embodiment according to the present invention.

FIG. 7 is a schematic perspective view of a display device 400 in one embodiment according to the present invention. Like in embodiment 1, for easier understanding, the display element layer 198 is shown as being separated from the display layer 102. The display element layer 198 includes the display elements allowing the display device 400 to display an image. The display elements are included in the pixels 120. Needless to say, the display elements are included in the display layer 102. Unlike the display device 100 shown in FIG. 1, the display device 400 shown in FIG. 7 does not include the touch sensor layer 112, and includes the second heat releasing layer 322 located in a part of the region of the display device 400. Except for these points, the display device 400 shown in FIG. 7 is the same as the display device 100 shown in FIG. 1, and the same components will not be described. The display device 400 may include the touch sensor layer 112. In such a case, the touch sensor layer 112 may be located between the second heat releasing layer 322 and the sealing layer 180 as shown in FIG. 4, or may be located between the second protective layer 324 and the second heat releasing layer 322 as shown in FIG. 6.

Figure 8:
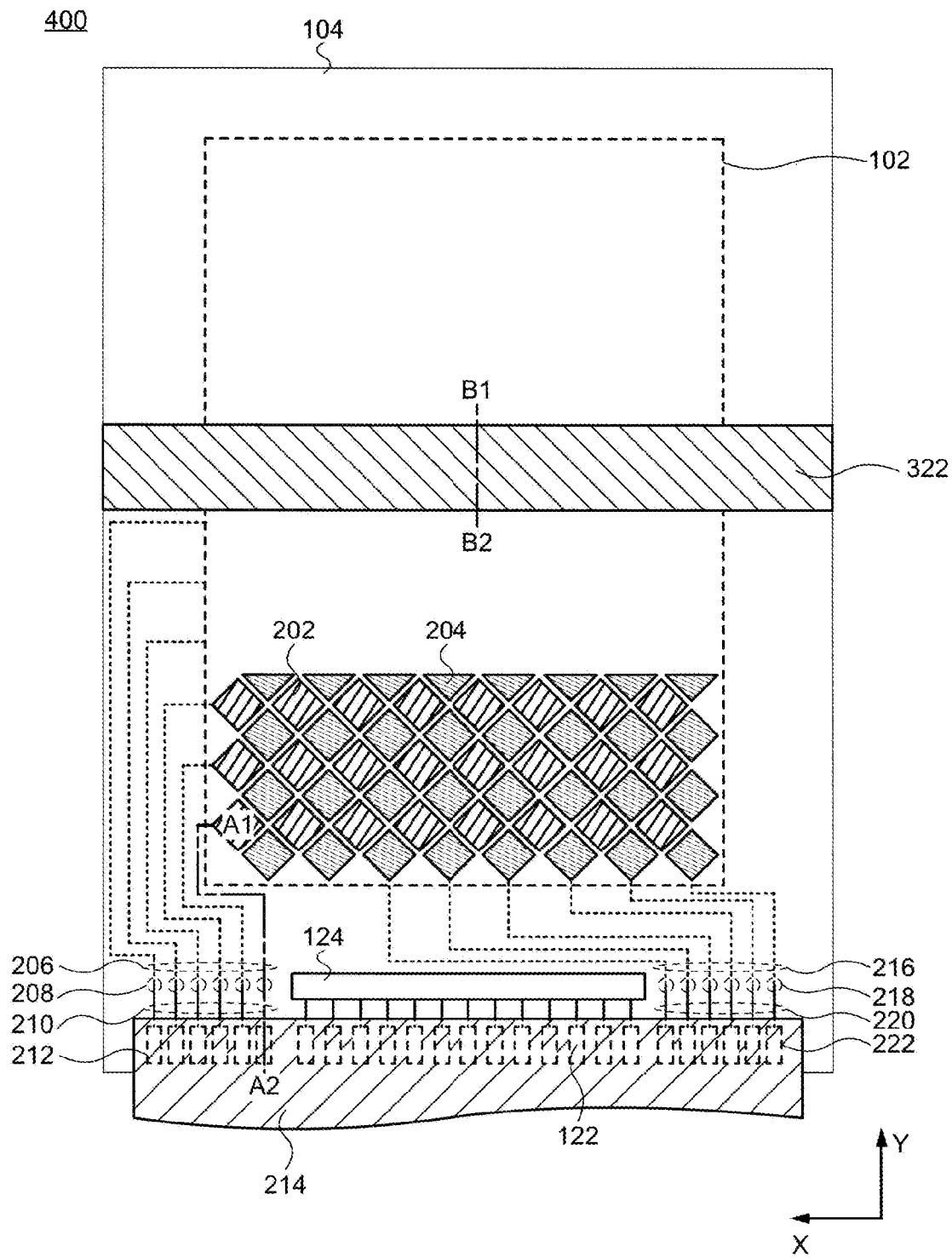
FIG. 8 is a schematic plan view of the display device in the still another embodiment according to the present invention.

FIG. 8 is a schematic plan view of the display device 400 in this embodiment according to the present invention. Unlike the display device 100 shown in FIG. 2, the display device 400 shown in FIG. 8 does not include the touch sensor layer 112, and includes the second heat releasing layer 322 located in a part of the region of the display device 400. Except for these points, the display device 400 shown in FIG. 8 is the same as the display device 100 shown in FIG. 2, and the same components will not be described. For easier understanding, FIG. 8 shows the flexible substrate 104 and the display layer 102. In actuality, the first heat releasing layer 310 and the first protective layer 312 are located below the flexible substrate 104, and the second heat releasing layer 322 and the second protective layer 324 are located above the display layer 102.

Although not shown, the display elements included in the display element layer 198 are, for example, light emitting elements or liquid crystal elements. The display elements are included in the pixels 120. In the display layer 102, the plurality of display elements is arrayed in one direction and another direction crossing the one direction. The TFT array layer 110 includes various circuit elements controlling capacitances or the like included in the pixels 120, a plurality of lines, and the like. The various circuit elements are, for example, transistors, capacitors, and resistors. The pixels 120 each include at least one display element, at least one transistor and at least one line that are connected with each other.

Figure 9:
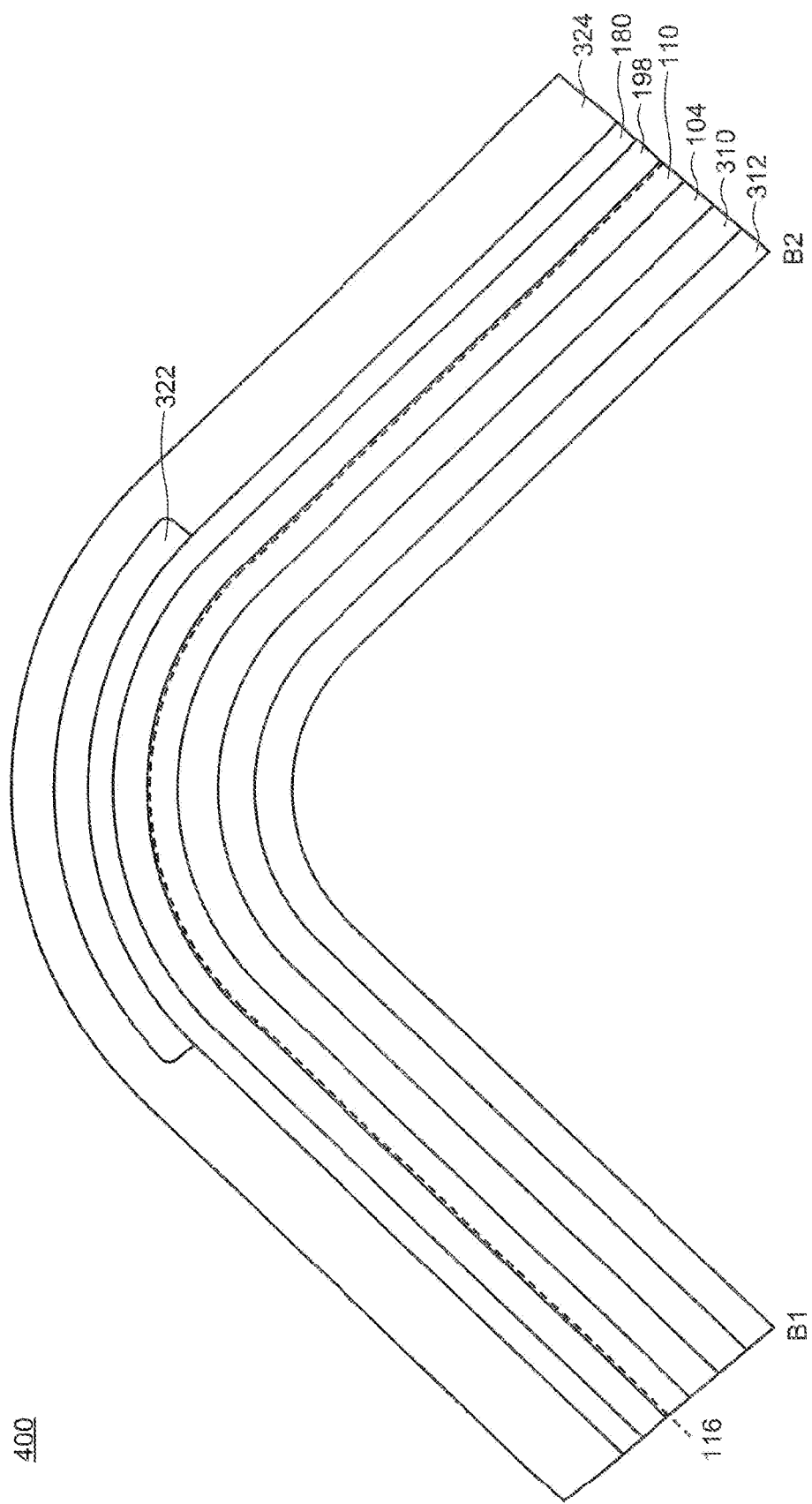
FIG. 9 is a schematic cross-sectional view of the display device in the still another embodiment according to the present invention.

FIG. 9 is a schematic cross-sectional view of the display device 400 in this embodiment according to the present invention. FIG. 9 schematically shows a cross-section taken along line B1-B2 in FIG. 8. Unlike the display device 100 shown in FIG. 4, the display device 400 shown in FIG. 9 does not include the touch sensor layer 112, and includes the second heat releasing layer 322 provided in a part of the region of the display device 400. Except for these points, the display device 400 shown in FIG. 9 is the same as the display device 100 shown in FIG. 4, and the same components will not be described. In FIG. 9, the layers, films and regions are shown as having substantially the same thickness for easier understanding of the stack structure of the display device 400. In actuality, the first protective layer 312 and the second protective layer 324 are thicker than the other layers, films and regions. The first heat releasing layer 310 and the second heat releasing layer 322 are thicker than the other layers, films and regions although being thinner than the first protective layer 312 and the second protective layer 324.

As shown in FIG. 9, the neutral surface 116 is continuous in the planar region of the display device 400. The second protective layer 324 covers the second heat releasing layer 322. In the display device 400, the second heat releasing layer 322 is located only in a region that has a high temperature and easily generates heat when the display device 400 is bent. An example of the region that easily generates heat is a heat generating component such as a battery or the like and the vicinity thereof. Another example of the region that easily generates heat is a region that is bent highly frequently while the display device 400 is used. FIG. 9 shows an example in which the neutral surface 116 is continuous in the planar region of the display device 400. The neutral surface 116 is not limited to this. The neutral surface 116 may be offset between in a region where the second heat releasing layer 322 is present and in a region where the second heat releasing layer 322 is absent. The thickness of a part of the second protective layer 324 that is in the region where the second heat releasing layer 322 is absent may be adjusted such that the neutral surface 116 is in the vicinity of the TFT array layer 110 and the display element layer 198. In other words, the neutral surface of the display device 100 is located in a layer including the TFT array layer 110 and the display element layer 198.

The first heat releasing layer 310 may also be located only in a region that easily generates heat. In this case, the first protective layer 312 covers the first heat releasing layer 310. With such a structure, the neutral surface 116 is made continuous. However, it is preferred that the first heat releasing layer 310 is located in the entirety of the planar region of the display device 400. A reason of this is that in the case where the display device 400 is mounted on a mobile information terminal or the like, a heat generating layer, for example, a layer including a battery or the like, is often located in the region below the flexible substrate 104, namely, in the region including the first heat releasing layer 310.

The above-described structure of the display device 400 allows the total volume of the heat releasing layer layers 310 and 322 to be decreased. This decreases the production cost of the display device 400. The display device 100 having the above-described structure allows the position of the neutral surface 116 to be adjusted and has a high level of durability against bending and a high level of reliability against heat.

Embodiment 4

In this embodiment, a method for producing the display device 100 according to the present invention in the case where the display device 100 is an organic electroluminescence display device will be described. Components same as those in embodiment 1 to embodiment 3 may not be described.

Figure 10:
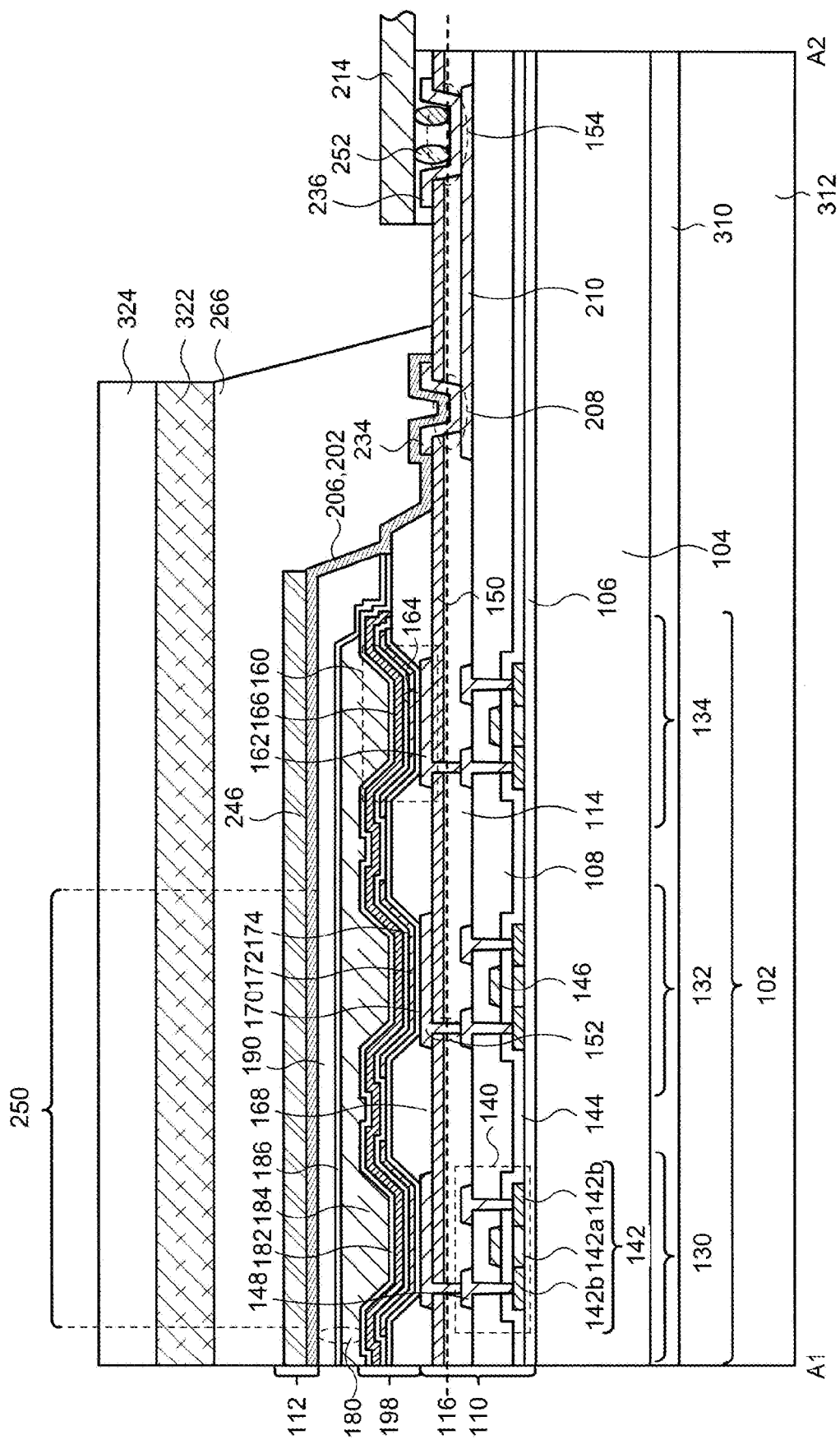
FIG. 10 is a schematic cross-sectional view of the display device in the still another embodiment according to the present invention.

A method for producing the display device 100 will be described with reference to FIG. 10 to FIG. 16B. FIG. 10 is a cross-sectional view of the display device 400 taken along line A1-A2 shown in FIG. 8. FIG. 11A to FIG. 16B are each a cross-sectional view showing a step of the method for producing the display device 100. The cross-sections shown in FIG. 11A to FIG. 16B correspond to the cross-section shown in FIG. 10. In the following, regarding the structure of the plurality of sub pixels, the structure of, generally, one sub pixel will be described for the sake of simplicity.

Figure 11A:
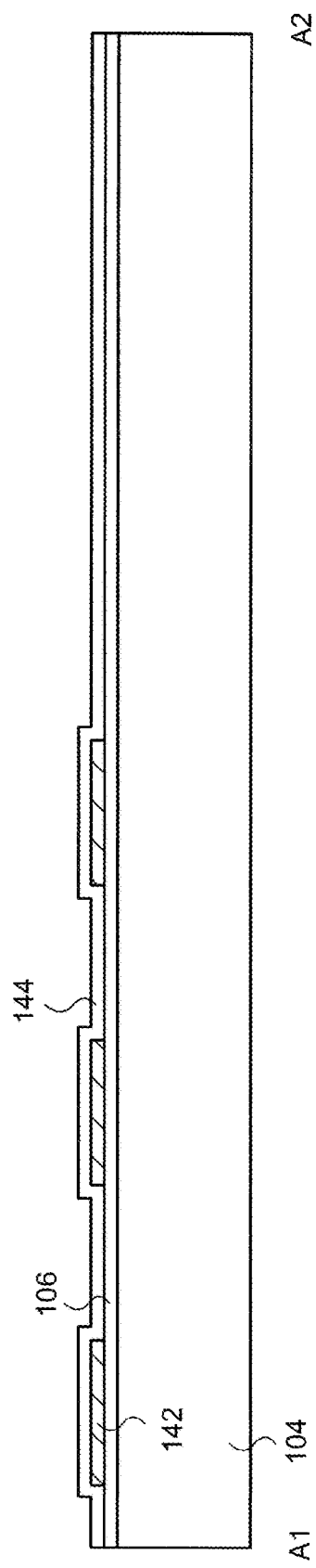
FIG. 11A is a schematic cross-sectional view showing a step of a method for producing the display device in the still another embodiment according to the present invention.

First, as shown in FIG. 11A, an underlying film 106 is formed on the flexible substrate 104. The flexible substrate 104 has a function of supporting the semiconductor elements, such as transistors 140 and the like, included in the display layer 102 and also supporting the touch sensor layer 112, and the like. Therefore, the flexible substrate 104 may be formed of a material that is resistant against the temperature used to form the components to be formed thereon and is chemically stable against the chemicals used in the formation of the components. Specifically, the flexible substrate 104 may contain a material selected from glass, quartz, plastic materials, metal materials, ceramic material, and polymer materials including polyimide, polyamide, polyester, polycarbonate and the like.

The flexible substrate 104 may be formed on a base member formed of glass or the like. In this case, the base member on which the flexible substrate 104 is formed is referred to also as a "support substrate". The flexible substrate 104 may be formed by, for example, a printing method, a wet film formation method such as ink-jetting, spin-coating, dip-coating or the like, a lamination method or the like. In such a case, after the layers included in the display device 100 are formed on the flexible substrate 104, the support substrate is peeled off from the interface between the flexible substrate 104 and the support substrate. Thus, the display device 100 is made flexible. Alternatively, the flexible substrate 104 may be simply formed of any of the above-described flexible materials with no use of the support substrate. Although not shown, the flexible substrate 104 may include a base member formed of glass or the like, and an insulating film, a flexible film or the like, that are bonded together by use of a viscous material such as an adhesive or the like.

The underlying film 106 has a function of preventing impurities such as an alkaline metal material or the like from being diffused from the flexible substrate 104 into the transistors 140 or the like. The underlying film 106 may contain silicon nitride, silicon oxide, silicon nitride oxide or silicon oxide nitride. The underlying film 106 is formed by chemical vapor deposition (CVD) or sputtering. The underlying film 106 may be of a single layer or of a stack structure. In the case where the flexible substrate 104 has a low impurity concentration, the underlying film 106 may not be provided, or may be provided to cover a part of the flexible substrate 104.

Next, a semiconductor film 142 is formed (FIG. 11A). The semiconductor film 142 may contain, for example, silicon. Alternatively, the semiconductor film 142 may contain an oxide semiconductor. The oxide semiconductor may be, for example, a mixed oxide of indium and gallium (IGO) or a mixed oxide containing indium, gallium and zinc (IGZO). The semiconductor film 142 may be single-crystalline, polycrystalline, microcrystalline, or amorphous.

In the case of containing silicon, the semiconductor film 142 may be formed by CVD by use of silane gas or the like as material gas. The resultant amorphous silicon is heated or irradiated with laser light or the like to be crystallized. In the case of containing an oxide semiconductor, the semiconductor film 142 may be formed by sputtering or the like.

Next, a gate insulating film 144 is formed to cover the semiconductor film 142 (FIG. 11A). The gate insulating film 144 may be of a single layer or of a stack structure. The gate insulating film 144 may be formed by substantially the same method as that of the underlying film 106.

Figure 11B:
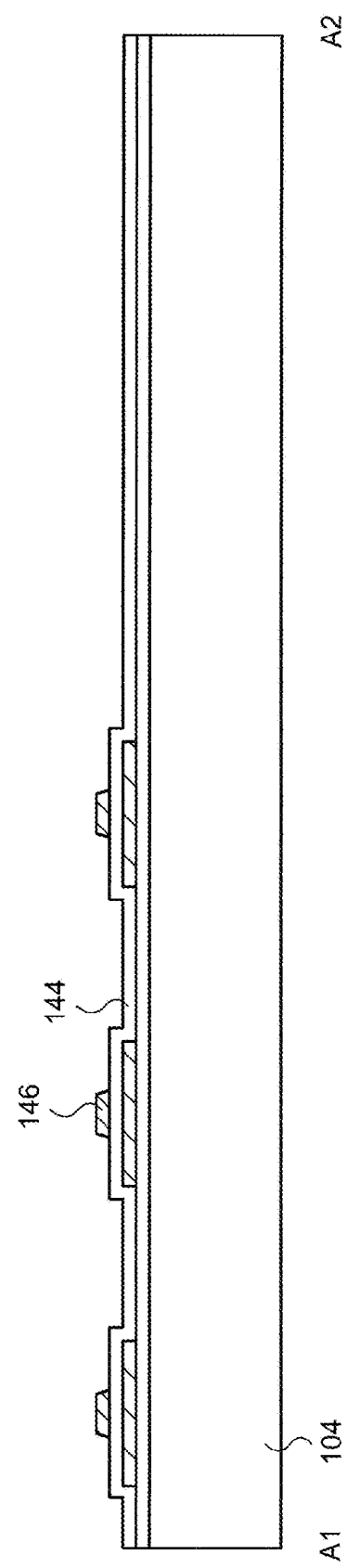
FIG. 11B is a schematic cross-sectional view showing a step of the method for producing the display device in the still another embodiment according to the present invention.

Next, a gate electrode 146 is formed on the gate insulating film 144 by sputtering or CVD (FIG. 11B). The gate electrode 146 is formed of a metal material such as titanium, aluminum, copper, molybdenum, tungsten, tantalum or the like, or an alloy thereof. The gate electrode 146 may be of a single layer or of a stack structure. For example, the gate electrode 146 may have a structure in which a layer of a highly conductive metal material such as aluminum, copper or the like is sandwiched between layers of a metal material having a relatively high melting point such as titanium tungsten, molybdenum or the like.

Figure 12A:
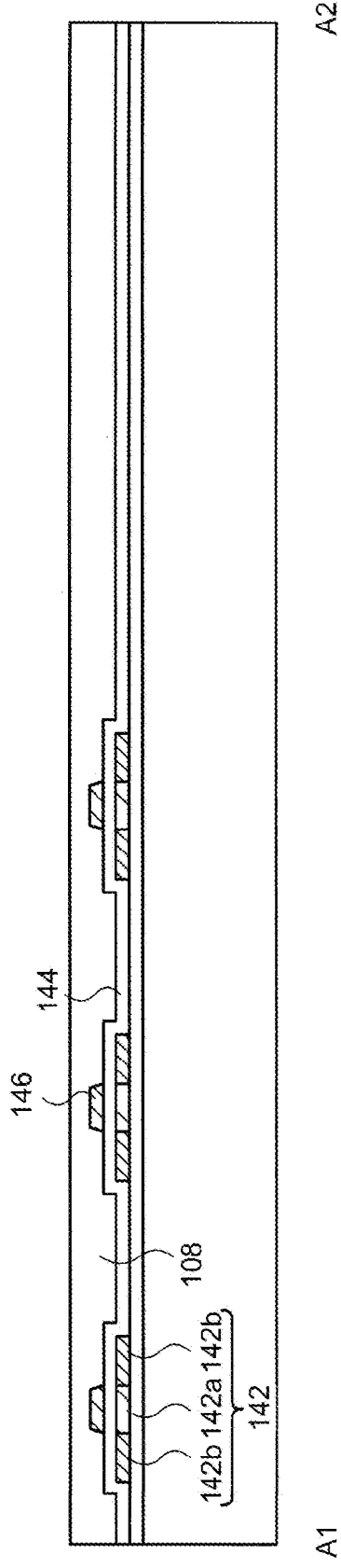
FIG. 12A is a schematic cross-sectional view showing a step of the method for producing the display device in the still another embodiment according to the present invention.

Next, an interlayer film 108 is formed on the gate electrode 146 (FIG. 12A). The interlayer film 108 may be of a single layer or of a stack structure. The interlayer film 108 may be formed by substantially the same method as that of the underlying film 106. In the case where the interlayer film 108 is of a stack structure, a layer containing an organic compound may be formed and then a layer containing an inorganic compound may be stacked thereon, for example. In the case where the semiconductor film 142 contains silicon, after the gate electrode 146 is formed, the semiconductor film 142 may be doped with impurities of phosphorus, boron or the like to form source/drain regions 142b. In this step, a region where the gate electrode 146 and the semiconductor film 142 overlap each other becomes a channel region 142a.

Figure 12B:
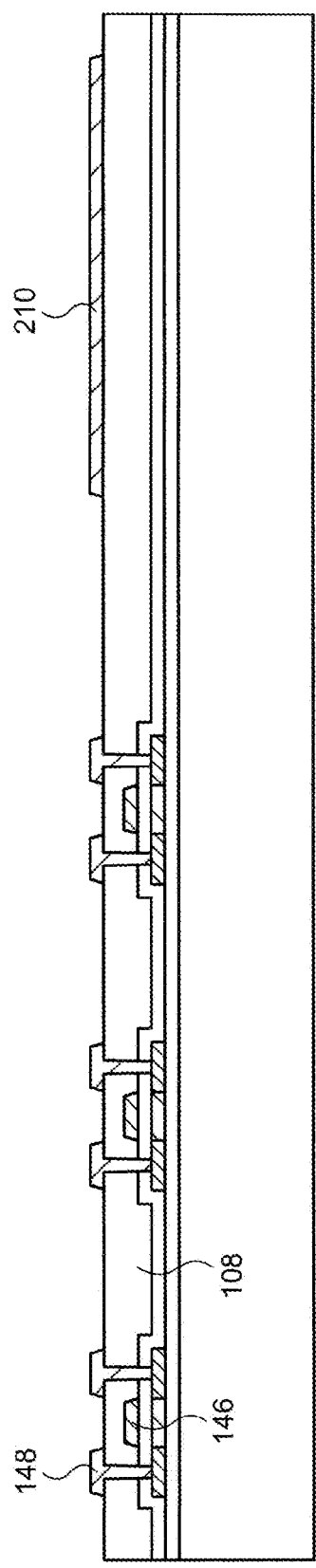
FIG. 12B is a schematic cross-sectional view showing a step of the method for producing the display device in the still another embodiment according to the present invention.

Next, the interlayer film 108 and the gate insulating film 144 are etched to form openings reaching the semiconductor film 142 (FIG. 12B).

Next, a metal film is formed to fill the openings to form source/drain electrodes 148. In this embodiment, the first terminal line 210 is formed concurrently with the source/drain electrodes 148 (FIG. 12B). Therefore, the source/drain electrodes 148 and the first terminal line 210 may be present in the same layer. The metal film may have substantially the same structure as that of the gate electrode 146, and may be formed by substantially the same method as that of the gate electrode 146.

Figure 13A:
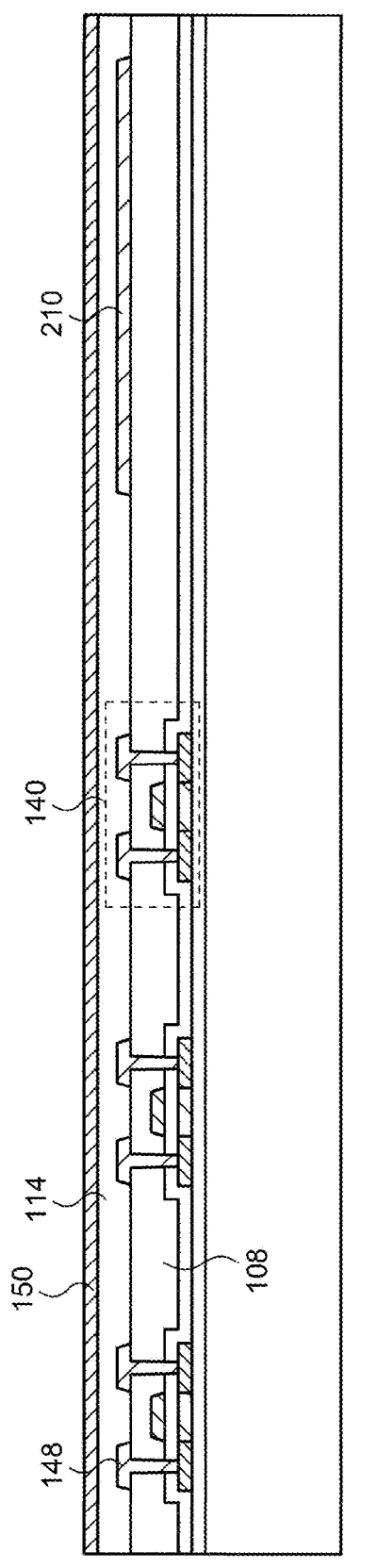
FIG. 13A is a schematic cross-sectional view showing a step of the method for producing the display device in the still another embodiment according to the present invention.

Next, a flattening film 114 is formed to cover the source/drain electrodes 148 and the first terminal line 210 (FIG. 13A). The flattening film 114 has a function of absorbing concaved and convexed portions and inclining portions caused by the formation of the transistors 140 and the first terminal line 210 to provide a flat surface. The flattening film 114 may be formed of an organic insulating material. The organic insulating material may be, for example, a polymer material such as an epoxy resin, an acrylic resin, polyimide, polyamide, polyester, polycarbonate, polysiloxane or the like. The flattening film 114 may be formed by, for example, a wet film formation method as described above.

Next, an inorganic insulating film 150 is formed on the flattening film 114 (FIG. 13A). The inorganic insulating film 150 acts as a protective film for the transistors 140 and forms a capacitance (not shown) together with a first electrode 162 of a light emitting element 160 to be formed later. Therefore, it is preferred that the inorganic insulating film 150 is formed of a material having a relatively high dielectric constant. The inorganic insulating film 150 may be formed of, for example, silicon nitride, silicon nitride oxide or silicon oxide nitride. The inorganic insulating film 150 may be formed by CVD or sputtering.

Figure 13B:
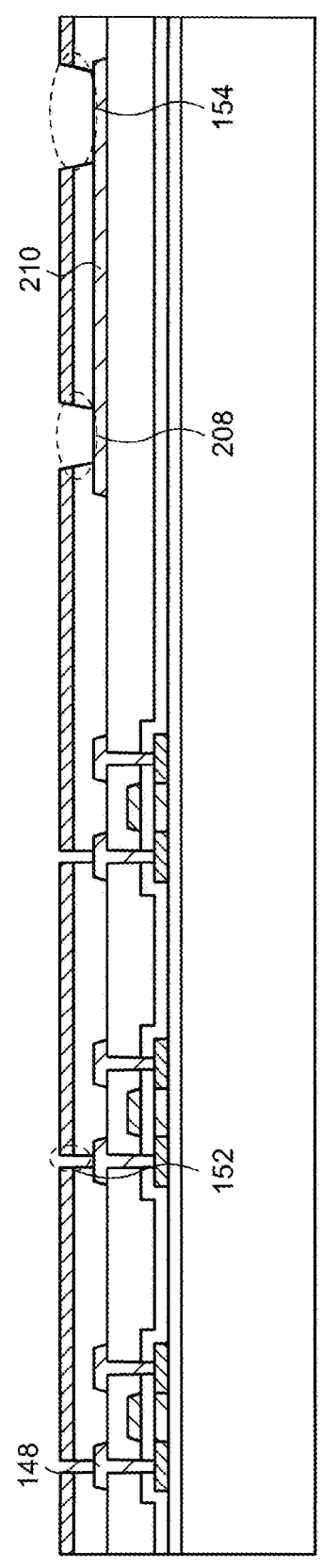
FIG. 13B is a schematic cross-sectional view showing a step of the method for producing the display device in the still another embodiment according to the present invention.
Figure 14A:
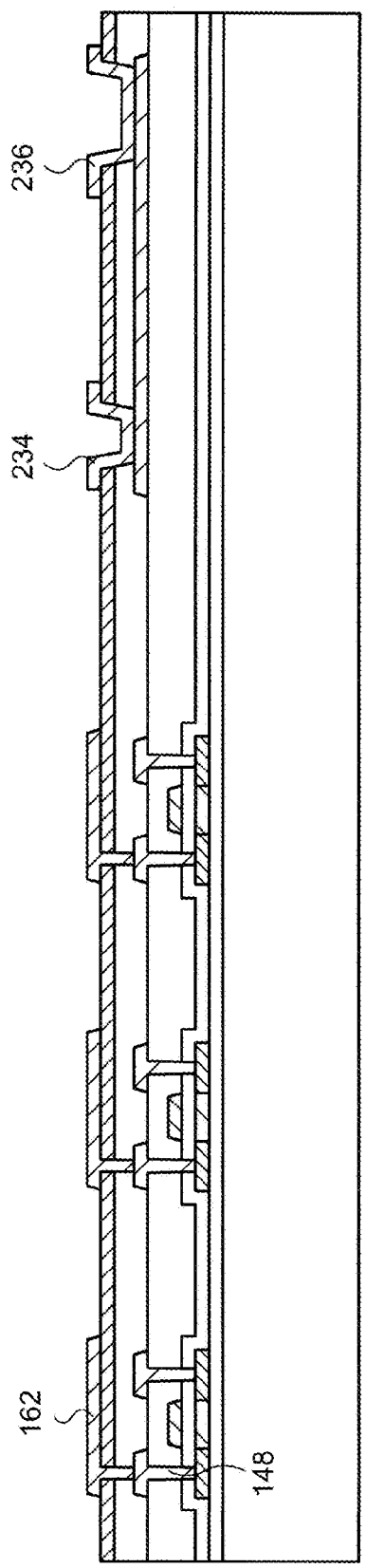
FIG. 14A is a schematic cross-sectional view showing a step of the method for producing the display device in the still another embodiment according to the present invention.

Next, as shown in FIG. 13B, a contact hole 152, a contact hole 208 and an opening 154 are formed. Then, the first electrode 162, a connection electrode 234 and a connection electrode 236 are formed to fill the contact hole 152, the contact hole 208 and the opening 154 (FIG. 14A).

The region where the connection electrode 236 is formed is, for example, the opening 154. In a later step, the opening 154, in which the connection electrode 236 is formed, is to be a region where the connection electrode 236 is connected with the connector 214 such as an FPC or the like via an anisotropic conductive film or the like. Therefore, the opening 154 is much larger than the region where the connection electrode 234 is formed. The region where the connection electrode 234 is formed is, for example, the contact hole 208. The size of the opening 154 varies in accordance with, for example, the terminal pitch of the connector 214. For example, the opening 154 has a width of 10 μm to 60 μm and a length of 1 mm to 2 mm. By contrast, it is sufficient that the contact hole 208 has a size of approximately several micrometers by several micrometers to approximately several ten micrometers to several ten micrometers at the minimum. There is a limit on the smallest possible size of the opening 154 due to the process of mounting the connector 214. By contrast, the contact hole 208 may have a minimum possible size at which the conductive layers to be connected in this region (in this example, the first line terminal 210, the connection electrode 234 and the first line 206) are connected with each other at a sufficiently low contact resistance.

In the case where light emitted by the light emitting element 160 is to be extracted through a second electrode 166, the first electrode 162 is configured to reflect visible light. In this case, the first electrode 162 contains a highly reflective metal material such as silver, aluminum, magnesium or the like, or an alloy thereof. For example, a film of a light-transmissive conductive oxide is formed on the film containing such a metal material or alloy. The light-transmissive conductive oxide may be ITO, IZO or the like. In the case where the light emitted by the light emitting element 160 is to be extracted through the first electrode 162, the first electrode 162 may be formed of a light-transmissive conductive oxide.

In this embodiment, the first electrode 162, the connection electrode 234 and the connection electrode 236 are formed on the inorganic insulating film 150. Therefore, for example, a film of any of the above-described metal materials is formed to fill the contact hole 152, the contact hole 208 and the opening 154. Then, a film containing a visible light-transmissive conductive oxide is formed. These films are etched to form the first electrode 162, the connection electrode 234 and the connection electrode 236. Alternatively, a film of the conductive oxide, a film of any of the metal materials described above, the film of the conductive oxide may be sequentially stacked to fill the contact hole 152, the contact hole 208 and the opening 154, and then are etched to form the first electrode 162, the connection electrode 234 and the connection electrode 236. Still alternatively, a film of the conductive oxide may be formed to fill the contact hole 152, the contact hole 208 and the opening 154, and then a film of the conductive oxide, a film of any of the metal materials described above, and a film of the conductive oxide may be formed in a stacked manner to selectively fill the contact hole 152.

Figure 14B:
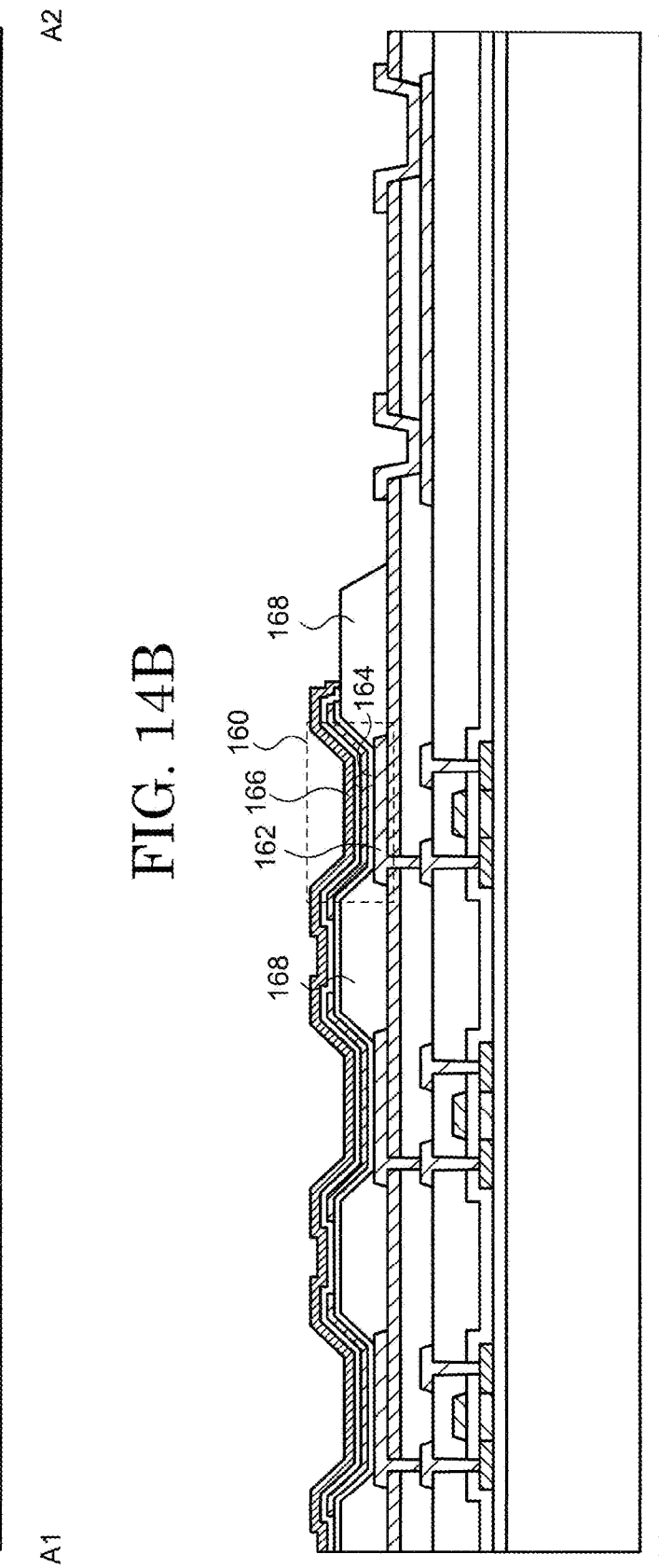
FIG. 14B is a schematic cross-sectional view showing a step of the method for producing the display device in the still another embodiment according to the present invention.

Next, a partition 168 is formed to cover an end of the first electrode 162 (FIG. 14B). The partition 168 absorbs steps caused by the formation of the first electrode 162 and the like, and electrically insulates the first electrodes 162 in two adjacent sub pixels. The partition 168 is formed of an epoxy resin or an acrylic resin by a wet film formation method.

Next, a functional layer 164 of the light emitting element 160 and the second electrode 166 are formed to cover the first electrode 162 and the partition 168 (FIG. 14B). The functional layer 164 mainly contains an organic compound, and is formed by a wet film formation method such as ink-jetting, spin-coating or the like, or a dry film formation method such as vapor deposition or the like.

In the case where the light emitted by the light emitting element 160 is to be extracted through the first electrode 162, the second electrode 166 may be formed of a metal material such as aluminum, magnesium, silver or the like, or an alloy thereof. In the case where the light emitted by the light emitting element 160 is to be extracted through the second electrode 166, the second electrode 166 may be formed of a light-transmissive conductive oxide such as ITO, IZO or the like. Alternatively, the second electrode 166 may be formed of any of the above-described metal materials with such a thickness that transmits visible light. In this case, a layer of a light-transmissive conductive oxide may be further stacked on the layer of the metal material.

Next, the sealing layer 180 is formed. As shown in FIG. 15A, the sealing layer 180 includes a first inorganic layer 182, an organic layer 184, a second inorganic layer 186, and an organic layer 190. The first inorganic layer 182 is formed to cover the light emitting element 160, the connection electrode 234 and the connection electrode 236. The first inorganic layer 182 may contain, for example, silicon nitride, silicon oxide, silicon nitride oxide or silicon oxide nitride. The first inorganic layer 182 may be formed by substantially the same method as that of the underlying film 106.

Next, the organic layer 184 is formed (FIG. 15A). The organic layer 184 may contain an organic resin such as an acrylic resin, polysiloxane, polyimide, polyester or the like. The organic layer 184 may be formed to have such a thickness that an upper surface thereof is flat. It is preferred that the organic layer 184 is selectively formed in the planar region of the display layer 102. More specifically, it is preferred that the organic layer 184 is formed so as to overlap neither the connection electrode 234 nor the connection electrode 236. The organic layer 184 may be formed by a wet film formation method such as ink-jetting or the like. According to another method for forming the organic layer 184, an oligomer usable to form any of the above-described polymer materials may be put into a mist-like or gas-like state under a low pressure and sprayed to the first inorganic layer 182, and then the oligomer may be polymerized. The organic layer 184 may be formed also by this method.

Then, the second inorganic layer 186 is formed (FIG. 15A). The second inorganic layer 186 may have substantially the same structure as that of, and may be formed by substantially the same method as that of, the first inorganic layer 182. The second inorganic layer 186 may be formed to cover the connection electrode 234 and the connection electrode 236 as well as the organic layer 184. As a result, the organic layer 184 is sealed by the first inorganic layer 182 and the second inorganic layer 186. This structure prevents entrance of moisture from outside. In this embodiment, the sealing layer 180 has a three-film structure as described above. Alternatively, the sealing layer 180 may include only the first inorganic layer 182, or two or more layers.

Next, the organic layer 190 is formed (FIG. 15B). The organic layer 190 may contain substantially the same material as that of, and may be formed of substantially the same method as that of, the organic layer 184 of the sealing layer 180. It is preferred that as shown in FIG. 15B, the organic layer 190 is formed selectively, more specifically, is formed in a region where the first inorganic layer 182 and the second inorganic layer 186 contact each other. It is also preferred that the organic layer 190 is formed so as to overlap neither the connection electrode 234 nor the connection electrode 236. Next, the organic layer 190 is used as a mask to perform etching, so that a portion of the first inorganic layer 182 and a portion of the second inorganic layer 186 that are exposed from the organic layer 190 are removed (FIG. 16A). As a result, the connection electrode 234 formed in the contact hole 208, which is located outside the display layer 102, is exposed. The connection electrode 236 formed in the opening 154, which is located outside the display layer 102, is exposed. In this step, the inorganic insulating film 150 may be partially etched away to be thinned.

As a result of the above-described process, the TFT array layer 110 (FIG. 10), the display element layer 198 (FIG. 10), and the sealing layer 180 (FIG. 10) are formed. The TFT array layer 110 and the display element layer 198 may each be thinner than the flexible substrate 104.

Then, the touch sensor layer 112 is formed. Specifically, the first touch electrode 202 is formed on the organic layer 190 (FIG. 16B). In this step, the second touch electrode 204 (FIG. 8) is formed concurrently. The first touch electrode 202 and the second touch electrode 204 may contain, as a main material, a light-transmissive conductive oxide. The light-transmissive conductive oxide may be ITO, IZO or the like.

The first terminal line 206 is formed concurrently with the first touch electrode 202 and the second touch electrode 204. The first terminal line 206 is formed to fill the contact hole 208. The first touch electrode 202 and the first terminal line 206 are electrically connected with each other (FIG. 16B).

Next, an interlayer film 246 is formed on the first touch electrode 202 and the second touch electrode 204 (FIG. 16B). The interlayer film 246 may be formed of substantially the same material as that of, by substantially the same method as that of, the organic layer 184.

According to another method for forming the interlayer film 246, the interlayer film 246 may be prepared in a sheet-like form, and then may be bonded to cover the plurality of first touch electrodes 202 and the plurality of second touch electrodes 204.

As a result of the above-described process, the touch sensor layer 112 is formed.

Then, an insulating film 266 (FIG. 10) is formed. The insulating film 266 may contain a polymer material such as polyester, an epoxy resin, an acrylic resin or the like. The insulating film 266 may be formed by a printing method, a lamination method or the like. In FIG. 10, the insulating film 266 is of a single-layer. Alternatively, the insulating film 266 may include two or more layers. Such a structure further improves the degree of flatness and thus improves the strength of the display device 100.

Although not shown, in the case where the flexible substrate 104 is provided on the base member formed of glass or the like, the flexible substrate 104 may be peeled off from the base member as follows, for example. After the connector 214 is formed, light such as laser light or the like is directed toward the flexible substrate 104, so that the adhesive force between the flexible substrate 104 and the base member is weakened. Thus, a physical force is used to peel off the flexible substrate 104.

Then, the first heat releasing layer 310, the second heat releasing layer 322, the first protective layer 312 and the second protective layer 324 are bonded to the structural body formed by the above-described process. Although not shown, the bonding may be formed by use of a viscous material such as an adhesive or the like.

The first heat protective layer 312 and the second protective layer 324 may each contain substantially the same polymer material as that of the insulating film 266. The first protective 312 and the second protective layer 324 may each contain a polymer material such as polyolefin, polyimide or the like, as well as any of the above-described polymer materials.

It is preferred that the first heat releasing layer 310 and the second heat releasing layer 322 are each formed of a highly transparent and highly heat-conductive material. Examples of such a material include carbon-based materials such as graphite sheet, carbon nanotube and the like, light-transmissive conductive materials such as indium tin oxide and the like, nanowires of aluminum (Al), silver (Ag) or an alloy thereof, and the like. Especially, many types of graphite sheet are highly heat-conductive. A display device in an embodiment according to the present invention that uses a graphite sheet easily allows heat to escape easily and does not easily cause the position of the neutral surface to be changed. In FIG. 10, the layers, films and regions are shown such that the stack structure of the display device 100 is easily understood. In actuality, the first protective layer 312 and the second protective layer 324 are thicker than the other layers, films and regions. The first heat releasing layer 310 and the second heat releasing layer 322 are thicker than the other layers, films and regions although being thinner than the first protective layer 312 and the second protective layer 324.

In order to prevent damage caused when, for example, the display device 100 is dropped or collides against something, it is preferred that the first protective layer 312 is thicker than the second protective layer 324. Also, in order to distance the lower surface of the display device 100 from a heat source such as the battery or the like, or in order to prevent the lower surface of the display device 100 from being directly subjected to heat from the heat source, it is preferred that the first protective layer 312 is thicker than the second protective layer 324. In the case where the first protective layer 312 and the second protective layer 324 are to have such a thickness relationship, the thicknesses thereof may be adjusted such that the neutral surface 116 is not displaced from the vicinity of the TFT array layer 110 and the display element layer 198.

In the above-described description of the method for producing the display device 100, the display device 100 is an organic electroluminescence display device that causes light to be output upward. It is preferred that the light transmittance of the second heat releasing layer 322 is higher than that of the first heat releasing layer 310. The light transmittance of the second heat releasing layer 322 is preferably 90% or higher.

In the case where the display device 100 is mounted on a mobile information terminal or the like, a heat generating layer, for example, a layer including a battery, is often provided in the region below the flexible substrate 104, namely, in the region in which the first heat releasing layer 310 is provided. Therefore, it is preferred that the heat conductivity of the first heat releasing layer 310 is higher than that of the second heat releasing layer 322. Specifically, where the heat conductivity of the first heat releasing layer 310 is k, it is preferred that the heat conductivity of the second heat releasing layer 322 is k×0.1 or higher and lower than k.

The display device 100 shown in FIG. 10 is produced by the above-described method. The display device in an embodiment according to the present invention produced in this manner has a structure in which the thicknesses of the heat releasing layers and the protective layers are easily adjustable such that the neutral surface is located in the vicinity of the TFT array layer and the display element layer. The display device in an embodiment according to the present invention, even if being bent, minimizes the stress applied to the TFT array layer and the display element layer in the vicinity of the neutral surface. Therefore, in the display device in an embodiment according to the present invention, the transistors and the capacitors included in the TFT array layer and the display element layer are prevented from being broken, and the display elements are prevented from being delaminated.

The display devices described above in the embodiments according to the present invention may have an element added thereto, or deleted therefrom, or may be changed in design optionally by a person of ordinary skill in the art. The methods described above in embodiments according to the present invention may have a step added thereto, or deleted therefrom, or may be changed in the condition optionally by a person of ordinary skill in the art. Such devices and methods are encompassed in the scope of the present invention as long as including the gist of the present invention. The above-described embodiments may be optionally combined as long as no contradiction occurs.

In this specification, the description is mainly for the display device. The present invention is also applicable to any type of flat panel displays such as another type of self-light emitting display device, a liquid crystal display device, an electronic paper-type display device including an electrophoretic element and the like. The present invention is also applicable to any size of display devices including small or middle-sized and large-sized display devices.

Even functions and effects that are different from those provided by the above-described embodiments but are obvious from the description of this specification or are easily expectable by a person of ordinary skill in the art are naturally construed as being provided by the present invention.

What is claimed is:

1. A display device, comprising:
a flexible substrate including a first surface and a second surface opposite the first surface;
a TFT array layer on the first surface;
display elements on the TFT array layer;
a first heat releasing layer on the second surface; and
a second heat releasing layer on the display elements,
wherein
the flexible substrate includes a first area, a second area and a third area,
the first area is in contact with the second area,
the second area is in contact with the third area,
the second area is provided between the first area and the third area,
the third area is not in direct contact with the first area,
the second area has two edges of the flexible substrate,
the second heat releasing layer is provided on an area where the display device is able to be bent,
the second heat releasing layer overlaps with the second area,
the first heat releasing layer overlaps with the first area, the third area, and the second area, and
at least one of the first area and the third area overlaps the display elements.

2. The display device according to claim 1, wherein the first area is bigger than the second area.

3. The display device according to claim 2, wherein the third area is bigger than the second area.

4. The display device according to claim 1, wherein the second area overlaps the display elements.

5. The display device according to claim 4, wherein the first area and the third area overlap the display elements.

6. The display device according to claim 1, wherein the second heat releasing layer overlaps with the two edges of the flexible substrate.

7. The display device according to claim 6, wherein the first heat releasing layer is wider than the second heat releasing layer.

8. The display device according to claim 1, wherein the flexible substrate is bent at the second area.

9. The display device according to claim 1, further comprising
a first protective layer is provided on the same side as the second surface.

10. The display device according to claim 1, further comprising
a second protective layer is provided on the display elements.

11. The display device according to claim 1, wherein the second heat releasing layer has a light transmittance of 90% or higher.

* * * * *